US009396362B2

(12) United States Patent
Nagata

(10) Patent No.: US 9,396,362 B2
(45) Date of Patent: Jul. 19, 2016

(54) ANALOG MULTIPLIER CIRCUIT, VARIABLE GAIN AMPLIFIER, DETECTOR CIRCUIT, AND PHYSICAL QUANTITY SENSOR

(75) Inventor: Yoichi Nagata, Nishitokyo (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 290 days.

(21) Appl. No.: 14/114,109

(22) PCT Filed: Apr. 25, 2012

(86) PCT No.: PCT/JP2012/061075
§ 371 (c)(1),
(2), (4) Date: Oct. 25, 2013

(87) PCT Pub. No.: WO2012/147784
PCT Pub. Date: Nov. 1, 2012

(65) Prior Publication Data
US 2014/0047920 A1 Feb. 20, 2014

(30) Foreign Application Priority Data
Apr. 25, 2011 (JP) .................. 2011-097012

(51) Int. Cl.
*G01C 19/56* (2012.01)
*G06G 7/00* (2006.01)
(Continued)

(52) U.S. Cl.
CPC .............. *G06G 7/00* (2013.01); *G01C 19/5776* (2013.01); *H03D 7/145* (2013.01); *H03D 7/1433* (2013.01);
(Continued)

(58) Field of Classification Search
CPC ..... G01C 19/5776; G06G 7/00; G06G 7/163; G06G 7/24; G06G 7/164; H03G 3/3047; H03G 3/3036; H03G 7/06; H03G 1/0023; H03F 3/193; H03F 3/3022; H03F 3/45183; H03F 3/45632; H03D 7/1433; H03D 7/145; H03D 7/1458; H03D 7/1492
USPC ...................... 73/504.12, 504.14; 702/86, 189
See application file for complete search history.

(56) References Cited

U.S. PATENT DOCUMENTS 5,006,818 A * 4/1991 Koyama ................ H03F 1/3211
330/261
5,182,477 A * 1/1993 Yamasaki ............. H03F 1/3211
327/309

(Continued)

FOREIGN PATENT DOCUMENTS

CN 201007707 Y 1/2008
JP 63-38313 A 2/1988
(Continued)

OTHER PUBLICATIONS

International Search Report of PCT/JP2012/061075, dated Jul. 3, 2012.

(Continued)

*Primary Examiner* — Helen Kwok
(74) *Attorney, Agent, or Firm* — Sughrue Mion, PLLC

(57) ABSTRACT

Provided is a technology capable of preventing arithmetic operation accuracy from deteriorating even when a bipolar transistor used to form a Gilbert multiplier core has poor characteristics. A correction current generating circuit (3) uses a constant current source (301) to feed a constant current $I_0$ to an emitter of a bipolar transistor (Q7) being a first replica transistor having the same current gain $\alpha$ as bipolar transistors (Q1 to Q4) that form the Gilbert multiplier core (101), to generate a current of $\alpha \cdot I_0$ on a collector side thereof. The current is output as a correction current $\alpha \cdot I_0$, and is added to each of one of input signals ($\pm K1 \cdot Vy$) of the Gilbert multiplier core (101) as a bias current, to thereby eliminate influence of the current gain $\alpha$ on an output signal being a multiplication result.

14 Claims, 10 Drawing Sheets

(51) Int. Cl.
*H03D 7/14* (2006.01)
*H03F 3/193* (2006.01)
*H03F 3/30* (2006.01)
*H03F 3/45* (2006.01)
*G01C 19/5776* (2012.01)
*H03G 1/00* (2006.01)

(52) U.S. Cl.
CPC ........... *H03D 7/1458* (2013.01); *H03D 7/1491* (2013.01); *H03F 3/193* (2013.01); *H03F 3/3022* (2013.01); *H03F 3/45183* (2013.01); *H03F 3/45632* (2013.01); *H03G 1/0023* (2013.01); *H03D 2200/0025* (2013.01); *H03D 2200/0033* (2013.01); *H03F 2203/45244* (2013.01)

(56) References Cited

U.S. PATENT DOCUMENTS

| | | | | |
|---|---|---|---|---|
| 5,668,750 | A * | 9/1997 | Kimura | G06G 7/163 327/356 |
| 5,684,431 | A * | 11/1997 | Gilbert | H03G 7/06 330/254 |
| 5,712,810 | A * | 1/1998 | Kimura | G06G 7/164 327/359 |
| 5,831,468 | A * | 11/1998 | Kimura | G06G 7/164 327/356 |
| 5,912,834 | A * | 6/1999 | Kimura | G06G 7/163 327/357 |
| 6,456,142 | B1 * | 9/2002 | Gilbert | G06G 7/163 327/356 |
| 7,310,656 | B1 * | 12/2007 | Gilbert | G06G 7/24 708/851 |
| 2004/0155694 | A1 * | 8/2004 | Trankle | G06G 7/163 327/356 |
| 2004/0266371 | A1 * | 12/2004 | Summers | H03G 3/3047 455/127.1 |
| 2013/0173196 | A1 * | 7/2013 | Nagata | G06F 17/00 702/86 |

FOREIGN PATENT DOCUMENTS

| | | |
|---|---|---|
| JP | 10-12627 A | 1/1998 |
| JP | 2005-512384 A | 4/2005 |
| JP | 2005-191840 A | 7/2005 |
| JP | 2007-81530 A | 3/2007 |
| JP | 2008-219116 A | 9/2008 |

OTHER PUBLICATIONS

Paul R. Gray, et al., "Analysis and Design of Analog Integrated Circuits", John Wiley and Sons, Inc., 1984, pp. 590-601, Second Edition.
International Preliminary Report on Patentability and Written Opinion issued in corresponding PCT/JP2012/061075 dated Nov. 7, 2013.
Communication dated Sep. 29, 2015 from the Intellectual Property Office of P.R. of China issued in corresponding application No. 201280020445.5.
Chao Liu, "Design of a High-Linearity and Low Distortion Analog Muliplier", Microelectronics, vol. 40, No. 6, Dec. 2010, pp. 796-800.
Communication dated Nov. 17, 2015, issued by the Japan Patent Office in corresponding Japanese Application No. 2013-512402.

* cited by examiner $$\alpha = \frac{I_C}{I_E}$$

ANALOG MULTIPLIER CIRCUIT, VARIABLE GAIN AMPLIFIER, DETECTOR CIRCUIT, AND PHYSICAL QUANTITY SENSOR

CROSS REFERENCE TO RELATED APPLICATIONS

This application is a National Stage of International Application No. PCT/JP2012/061075 filed Apr. 25, 2012, claiming priority based on Japanese Patent Application No. 2011-097012, filed Apr. 25, 2011, the contents of all of which are incorporated herein by reference in their entirety.

TECHNICAL FIELD

The present invention relates to an analog multiplier circuit that uses a multiplier core such as a Gilbert multiplier core, a detector circuit and a variable gain amplifier to each of which the analog multiplier circuit is applied, and a physical quantity sensor such as an oscillation type angular velocity sensor that uses the detector circuit.

BACKGROUND ART

A physical quantity sensor represented by an oscillation type angular velocity sensor generally needs a detector circuit for detecting an output signal from a sensor element thereof and extracting a signal component therefrom. As one of such detector circuits, there is known a detector circuit that uses a Gilbert multiplier being an analog multiplier circuit (for example, Patent Literature 1).

The Gilbert multiplier (Gilbert multiplier core) generally includes a dual differential circuit formed of four bipolar transistors, and outputs a signal proportional to a product of two input signals. The Gilbert multiplier that uses the bipolar transistors has a problem of nonlinearity caused by exponential characteristics of the bipolar transistors. Therefore, there is also known an analog multiplier circuit provided with a circuit that performs preprocessing for achieving linearization by suppressing nonlinear components in the Gilbert multiplier core (for example, Non Patent Literature 1).

An example of such a conventional analog multiplier circuit that uses the Gilbert multiplier core is described with reference to FIG. 9. The analog multiplier circuit 100 includes a Gilbert multiplier core 101 and a linearizer circuit 102.

The Gilbert multiplier core 101 includes a dual differential circuit formed of four bipolar transistors including a pair of bipolar transistors Q1 and Q2 and a pair of bipolar transistors Q3 and Q4. The Gilbert multiplier core 101 outputs an output signal based on a differential current proportional to the product of a first input signal, which is input to a first input terminal pair including Ta and Tb each being a common emitter node of the pair of transistors, and a second input signal, which is input to a second input terminal pair including Tc and Td each being a common base node, from an output terminal pair including Te and Tf each being a common collector node.

The linearizer circuit 102 is an I-V conversion circuit that performs preprocessing for achieving linearization by using an arc hyperbolic function (tan h$^{-1}$) to suppress the nonlinear components caused by the exponential characteristics of the bipolar transistors Q1 to Q4 that form the Gilbert multiplier core 101. The linearizer circuit 102 includes a pair of bipolar transistors Q5 and Q6 being linearizing transistors connected between the respective terminals of the second input terminal pair Tc and Td of the Gilbert multiplier core 101 and a negative power source (−V). Each of the bipolar transistors Q5 and Q6 is diode-connected, that is, has its base and its collector directly connected to each other. The diode-connected bipolar transistors Q5 and Q6 are each connected in a forward direction along a direction in which a current flows.

When the product of two input signals Vy and Vx each being a voltage signal is obtained by the analog multiplier circuit 100, the input signal Vy is converted by a V-I conversion circuit 110 into a differential current including positive and negative current signals (+K1·Vy) and (−K1·Vy) by using a conversion factor K1. The differential current has a bias current $I_0$ added to each of its components by constant current sources 2a and 2b to be set as a differential current ($I_0$±K1·Vy) including the bias current, which is input to the second input terminal pair Tc and Td of the Gilbert multiplier core 101. On this occasion, the differential current ($I_0$±K1·Vy) is converted into a differential voltage signal Vi expressed by the following expression by the linearizer circuit 102, and input to the Gilbert multiplier core 101. $V_T$ is a so-called thermal voltage.

$$Vi = 2 \cdot V_T \cdot \tan h^{-1}(K1 \cdot Vy/I_0)$$

On the other hand, the input signal Vx is converted by a V-I conversion circuit 120 into a differential current having positive and negative current signals (+K2·Vx) and (−K2·Vx) by using a conversion factor K2. The differential current has a bias current Ib added to each of its components by constant current sources 2c and 2d to be set as a differential current (Ib±K2·Vx) including the bias current, which is input to the first input terminal pair Ta and Tb of the Gilbert multiplier core 101.

With this configuration, a differential current I4 (a pair of positive and negative currents) is output as a multiplication result from the output terminal pair Te and Tf of the Gilbert multiplier core 101. An I-V conversion circuit 150 converts the differential current I4 into a voltage by using a conversion factor K5, and outputs an output voltage Vout expressed by the following expression.

$$Vout = 2 \cdot K1 \cdot K2 \cdot K5 \cdot (Vx \cdot Vy/I_0)$$

The coefficient "2" on the right-hand side of the above-mentioned expression is a factor corresponding to the fact that the voltage doubles due to the respective conversion of the positive and negative components. By indicating the factor "2" and the conversion factors K1, K2, and K5 collectively by K, the above-mentioned expression can be rewritten as follows. Note that, the bias current Ib is canceled, and therefore does not appear in the final expression of Vout.

$$Vout = K \cdot (Vx \cdot Vy/I_0)$$

$I_0$ is the bias current from the constant current source, and hence the output voltage Vout is proportional to the product Vx·Vy of the two input signals. When a setting is made so that $K/I_0=1$, Vout=Vx·Vy is derived. In this manner, the product of the two input signals can be obtained.

CITATION LIST

Patent Literature

[Patent Literature 1] JP 2005-191840 A

Non Patent Literature

[Non Patent Literature 1] ANALYSIS AND DESIGN OF ANALOG INTEGRATED CIRCUIT (2nd Edition) Paul R. Gray/Robert G. Meyer, John Wiley and Sons, Inc. 1984 (p. 596-600)

SUMMARY OF INVENTION

Technical Problem

A multiplication result obtained from such an analog multiplier circuit is subject to influence of a current gain $\alpha$ ($\alpha$ = (collector current $I_C$)/(emitter current $I_E$), $\alpha<1$) of a bipolar transistor that forms a Gilbert multiplier core, and is reduced in accordance with a to become Vout=K·(Vx·Vy/$I_0$)·$\alpha$.

However, a bipolar junction transistor excellent in performance is normally used for such a multiplier circuit. Such a transistor only produces a loss of a slight base current, and hence $\alpha=I_C/I_E$ is extremely close to 1. Further, a value of $\alpha$ of the transistor does not greatly fluctuate depending on a manufacturing process or an environment temperature, and is therefore regarded as a constant coefficient. Therefore, in this case, the influence of $\alpha$ on the multiplication result is not so problematic.

However, depending on the use, a lateral PNP transistor relatively inferior in characteristics or a lateral bipolar transistor manufactured by a standard CMOS process may be used for the sake of a frequency band for signal processing or noise characteristics or in a case where, for example, the transistor is to be manufactured simultaneously on a substrate common with a CMOS device of a peripheral circuit.

FIG. 10 is a schematic sectional view illustrating an example of such a lateral bipolar transistor manufactured by a CMOS process.

A lateral bipolar transistor 5 illustrated in the figure is formed on a surface of a p-type semiconductor substrate 50. An n-well 51 is formed on a surface side of the p-type semiconductor substrate 50, and an n-rich portion 52 and two p-rich portions 53 and 54 are further formed in the vicinity of a surface of the n-well 51. Electrodes of a base B, an emitter E, and a lateral collector (normal collector) C are formed in the n-rich portion 52, the one p-rich portion 53, and the other p-rich portion 54, respectively, to thereby construct the PNP-type lateral bipolar transistor 5. However, in this device structure, the p-type semiconductor substrate 50 becomes a parasitic collector itself, and functions as a vertical collector C' of the transistor 5.

Therefore, the lateral bipolar transistor 5 can be expressed by a circuit symbol diagram illustrated in FIG. 11, and an unnecessary current (parasitic collector current) $I_C'$ flows in the vertical collector C'. An amount of the current $I_C'$ or a ratio of the current $I_C'$ to the collector current $I_C$ flowing in the lateral collector C fluctuates depending on the CMOS process, the environmental temperature, or the like, and hence the current gain $\alpha=I_C/I_E$ in turn fluctuates. The same applies to a case where an NPN-type lateral bipolar transistor is formed on the n-type semiconductor substrate.

That is, such a lateral bipolar transistor manufactured by a CMOS process does not have a sufficient current amplification characteristic, in other words, has a large reduction amount of the current gain $\alpha$ from 1. As a result, a ratio of a manufacturing error to an absolute value of the current gain $\alpha$ becomes large, and the current gain $\alpha$ easily fluctuates due to the influence of the manufacturing error. In addition, the current gain $\alpha$ fluctuates depending also on the temperature. Those fluctuations are hard to control.

Therefore, in the case where such a lateral bipolar transistor is used as the bipolar transistor that forms the Gilbert multiplier core of the analog multiplier circuit described above, a multiplication factor based on the current gain $\alpha$ fluctuates in an unpredictable manner, as a result of which there is a problem in that arithmetic operation accuracy deteriorates.

Even in a case where a general bipolar junction transistor is used, if the current amplification characteristic of the transistor is not sufficient (characteristic is not very excellent), the current gain $\alpha$ fluctuates depending on the temperature or the like, which causes the same problem.

In the case where such an analog multiplier circuit is used as a detector circuit, detection accuracy deteriorates, and in a physical quantity sensor such as an oscillation type angular velocity sensor that uses the detector circuit, detection accuracy of a physical quantity such as an angular velocity deteriorates.

Note that, this problem is not limited to the case where a multiplier core is the Gilbert multiplier core, and the same problem occurs even in the analog multiplier circuit that uses a multiplier core including a differential transistor pair including a pair of emitter-coupled bipolar transistors. In a case where the above-mentioned analog multiplier circuit is used as a variable gain amplifier, a problem occurs in that, for example, unintended gain fluctuations occur.

The present invention has been made in order to solve the above-mentioned problems, and it is an object thereof to avoid deterioration in arithmetic operation accuracy of an analog multiplier circuit using a multiplier core even in a case where a lateral bipolar transistor manufactured by a CMOS process, a bipolar junction transistor whose characteristics are not sufficiently excellent, or the like is used as a bipolar transistor that forms the multiplier core.

It is another object thereof to avoid deterioration in detection accuracy of a detector circuit that uses the analog multiplier circuit including the multiplier core and detection accuracy of a physical quantity sensor that uses the detector circuit or deterioration in amplification accuracy of a variable gain amplifier that uses the analog multiplier circuit.

Solution to Problem

In order to achieve the above-mentioned object, an analog multiplier circuit according to the present invention includes: a multiplier core including at least one differential transistor pair including a pair of emitter-coupled bipolar transistors, in which a coupled emitter point of the at least one differential transistor pair is set as a first input terminal, two bases of the differential transistor pair are set as a pair of second input terminals, and two collectors of the differential transistor pair are set as a pair of output terminals; a linearizer circuit including a linearizing transistor pair including a pair of bipolar transistors whose emitters are respectively connected to the second input terminal pair, in which each base and each collector of the linearizing transistor pair are each connected to a predetermined power source; and a correction current generating circuit for adding a correction current corresponding to a current gain of each of the bipolar transistors of the at least one differential transistor pair to a signal applied to the second input terminal pair.

It is preferred that the correction current generating circuit include a first replica transistor being a replica of each of the bipolar transistors of the at least one differential transistor pair, and generate the correction current based on a current obtained from a collector of the first replica transistor by feeding a predetermined bias current to an emitter of the first replica transistor.

It is more preferred that: the correction current generating circuit further include a second replica transistor being a replica of each of the bipolar transistors of the linearizing transistor pair; and an emitter of the second replica transistor be connected to a base of the first replica transistor, and a collector and a base of the second replica transistor be each connected to a predetermined power source.

It is preferred that the multiplier core include two differential transistor pairs described above, a pair of the first input terminals are respectively the coupled emitter points of the two differential transistor pairs, the pair of the second input terminals be respectively two bases coupled to each other between the two differential transistor pairs, and the pair of the output terminals be respectively two collectors coupled to each other between the two differential transistor pairs.

The correction current generating circuit may include: a replica multiplier unit being a replica of the multiplier core and the linearizer circuit, the replica multiplier unit including a first replica input terminal, a pair of second replica input terminals, and a pair of replica output terminals being replicas of the first input terminal, the pair of the second input terminals, and the pair of the output terminals, respectively; a comparing circuit for comparing a trial output signal corresponding to an output from the replica output terminal pair with an expected signal, and outputting a comparison result signal; a setting circuit for inputting a signal corresponding to a predetermined preparatory input value to each of the first replica input terminal and the second replica input terminal pair and inputting the expected signal corresponding to a predetermined expected value indicating a product of the preparatory input values to the comparing circuit; and a correction current output circuit for generating the correction current and a replica correction current that is a replica current of the correction current and is to be added to a signal applied to the second replica input terminal pair; and the correction current output circuit may increase/decrease the correction current and the replica correction current in accordance with the comparison result signal so that the trial output signal becomes equal to the expected signal.

A variable gain amplifier according to the present invention includes the analog multiplier circuit according to any one of the above-mentioned configurations including one differential transistor pair described above in the multiplier core, in which: a DC control signal is input to the first input terminal; an input signal is input to the second input terminal pair; and the variable gain amplifier obtains a variable signal based on an output signal of the output terminal pair.

A detector circuit according to the present invention includes the analog multiplier circuit according to the above-mentioned configuration including two differential transistor pairs described above in the multiplier core, in which: an AC signal having a constant amplitude is input to one of the first input terminal and the second input terminal pair, and a modulated signal is input to another one of the first input terminal and the second input terminal pair; and the detector circuit obtains a demodulated signal based on an output signal of the output terminal pair.

A physical quantity sensor according to the present invention includes: a vibratory transducer for converting a physical quantity applied from outside into an electric signal; a reference signal generating circuit for outputting a reference signal; an oscillating circuit for causing the vibratory transducer to oscillate based on the reference signal; and a detector circuit for demodulating an output signal from the vibratory transducer based on an oscillation signal from the oscillating circuit.

Then, the detector circuit of the physical quantity sensor is the detector circuit according to the present invention, the AC signal is the oscillation signal, and the modulated signal is the output signal from the vibratory transducer.

In the physical quantity sensor, it is more preferred that the correction current generating circuit generate the correction current based on the reference signal.

Advantageous Effects of Invention

When the current gain ($\alpha$) of the bipolar transistor that forms the multiplier core fluctuates in an unpredictable manner, the output voltage Vout obtained by the multiplier core multiplying the two input signals Vx and Vy becomes Vout=$K \cdot (Vx \cdot Vy/I_0) \cdot \alpha$. The analog multiplier circuit according to the present invention generates a correction current that increases in accordance with a by the correction current generation circuit, and adds the correction current to one of the input signals of the multiplier core, to thereby correct a bias current component ($I_0$) for the one of the input signals of the multiplier core to the current ($\alpha I_0$) obtained by multiplying the bias current component ($I_0$) by the current gain ($\alpha$). With this correction, the output voltage Vout obtained by the multiplier core multiplying the two input signals Vx and Vy becomes Vout=$K \cdot (Vx \cdot Vy/(\alpha \cdot I_0)) \cdot \alpha$.

Accordingly, a in the denominator and a in the numerator are canceled out to obtain Vout=$K \cdot (Vx \cdot Vy/I_0)$, and the output voltage Vout being the multiplication result is free of the influence of the current gain $\alpha$, which allows the multiplication to be performed with excellent accuracy at all times.

The detector circuit according to the present invention uses the analog multiplier circuit according to the present invention to perform detection by analog multiplication using an AC signal and a subject signal as two input signals, and is therefore able to perform the detection with high accuracy at all times. The variable gain amplifier according to the present invention uses the analog multiplier circuit according to the present invention to obtain a variable signal based on the output signal resulting from the analog multiplication of a control signal and an input signal, and is therefore able to perform variable amplification with excellent accuracy at all times.

The physical quantity sensor according to the present invention sets the output signal obtained by the vibratory transducer and corresponding to a physical quantity applied from outside as a subject signal, sets an oscillation signal for causing the vibratory transducer to oscillate as the above-mentioned AC signal, and uses the above-mentioned detector circuit according to the present invention to demodulate the subject signal and detect the physical quantity. Therefore, the physical quantity sensor according to the present invention able to detect the physical quantity with high accuracy at all times.

DESCRIPTION OF EMBODIMENTS

Now, a description is made of an analog multiplier circuit, a detector circuit, and a physical quantity sensor according to respective embodiments of the present invention with reference to the accompanying drawings FIG. 1 to FIG. 5.

Figure 1:
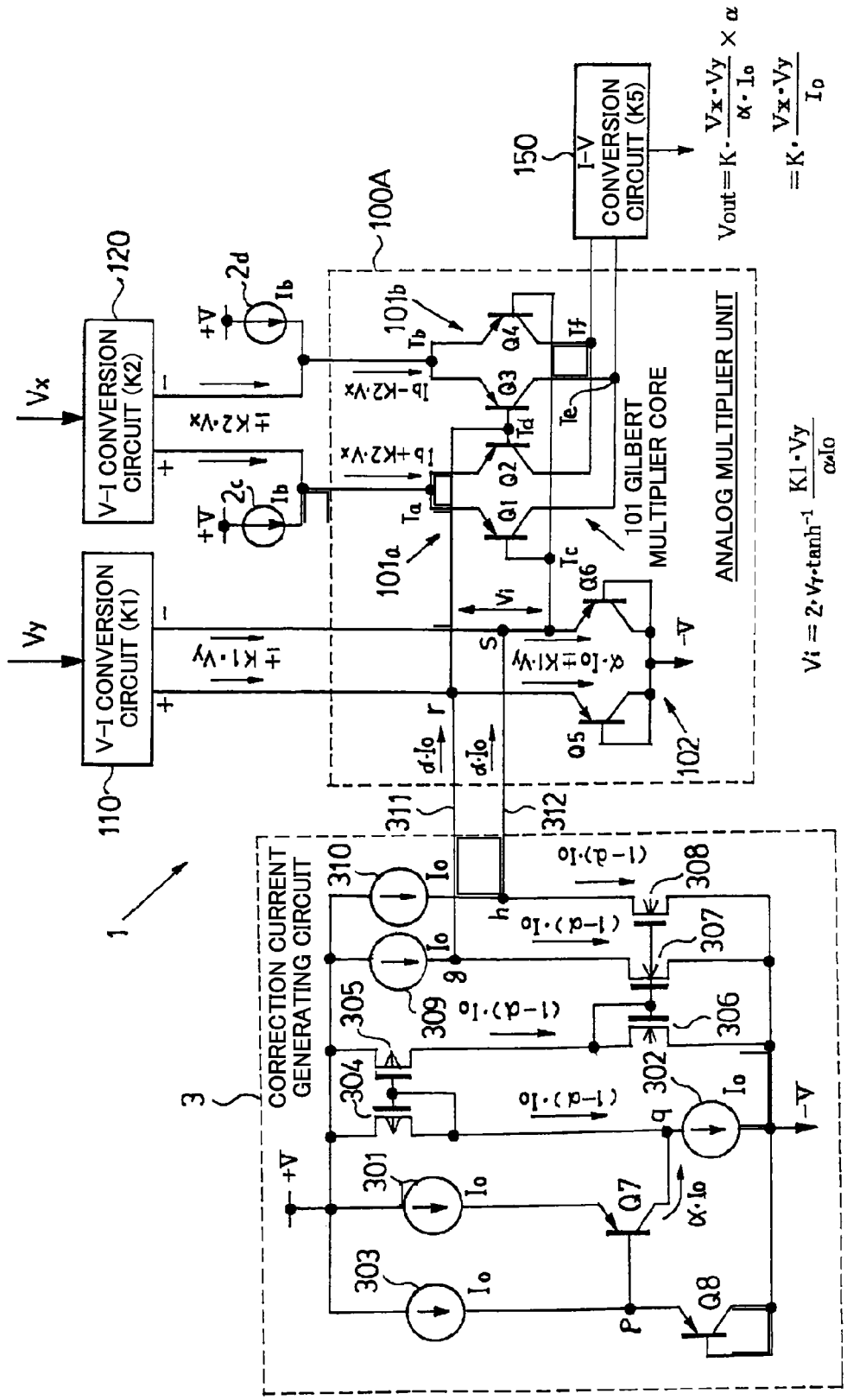
FIG. 1 is a circuit diagram illustrating an analog multiplier circuit and a detector circuit according to an embodiment of the present invention.

(Analog Multiplier Circuit of Embodiment: FIG. 1)

First, an analog multiplier circuit and a detector circuit according to an embodiment of the present invention are described with reference to FIG. 1. Note that, in FIG. 1, components corresponding to those described above with reference to FIG. 9 are denoted by the same reference symbols, and duplicate descriptions thereof are omitted.

An analog multiplier circuit 1 illustrated in FIG. 1 includes an analog multiplier unit 100A and a correction current generating circuit 3. In the same manner as a conventional analog multiplier circuit 100 described with reference to FIG. 9, the analog multiplier unit 100A includes a Gilbert multiplier core 101 and a linearizer circuit 102. Lateral bipolar transistors manufactured by a CMOS process described with reference to FIG. 10, bipolar junction transistors whose characteristics are not very excellent, or other such transistors are used as four bipolar transistors Q1 to Q4 that form the Gilbert multiplier core 101 of the analog multiplier unit 100A.

However, it is desired that bipolar transistors that form the analog multiplier circuit 1 be elements manufactured by the same manufacturing process to have the same structure and have identical characteristics as much as possible. This can be realized by a known semiconductor layout technology, that is, a method of arranging a large number of transistor elements having the same dimensions and using the elements adjacent to each other which are included therein. Absolute values of transistor element characteristics and a temperature change amount differ on a chip-to-chip basis depending on errors in a semiconductor manufacturing process, but by thus taking a geometric layout within the chip into consideration, it is possible to bring relative characteristics of the elements used within a circuit into agreement with each other with high accuracy.

The Gilbert multiplier core 101 is a multiplier core including two differential transistor pairs each including a pair of emitter-coupled bipolar transistors, in which a pair of first input terminals Ta and Tb are respectively coupled emitter points of the two differential transistor pairs, a pair of second input terminals Tc and Td are respectively two bases coupled to each other between the two differential transistor pairs, and a pair of output terminals Te and Tf are respectively two collectors coupled to each other between the two differential transistor pairs.

The linearizer circuit 102 is an I-V conversion circuit including a linearizing transistor pair including bipolar transistors Q5 and Q6 whose emitters are connected to the second input terminal pair Tc and Td of the above-mentioned differential transistor pair, respectively, in which each base and each collector of the linearizing transistor pair are each connected to a predetermined power source.

The correction current generating circuit 3 is a circuit for generating a correction current corresponding to a current gain α of each of the bipolar transistors Q1 to Q4 of the above-mentioned differential transistor pair and adding the correction current to a signal applied to the second input terminal pair Tc and Td.

In the analog multiplier circuit illustrated in FIG. 1, a voltage signal Vy being an AC signal having a constant amplitude is input to a V-I conversion circuit 110, and a voltage signal Vx being a modulated signal whose frequency is the same as the voltage signal Vy and whose amplitude changes is input to a V-I conversion circuit 120. With this configuration, the analog multiplier circuit 1 can be used as the detector circuit.

The analog multiplier circuit 1 outputs a voltage signal from an I-V conversion circuit 150 as a demodulated signal corresponding to the amplitude of the voltage signal Vx being the modulated signal.

Here, a specific description is made of a connection relationship among the four bipolar transistors ("bipolar transistors" hereinafter referred to simply as "transistors") Q1 to Q4 that form a dual differential circuit of the Gilbert multiplier core 101.

The Gilbert multiplier core 101 includes a first differential transistor pair 101a including the pair of transistors Q1 and Q2 and a second differential transistor pair 101b including the pair of transistors Q3 and Q4.

Emitters of the transistors Q1 and Q2 are connected in common to each other, and a coupled emitter point therebetween forms the input terminal Ta being one of the first input terminal pair, while emitters of the transistors Q3 and Q4 are connected in common to each other, and a coupled emitter point therebetween forms the input terminal Tb being the other of the first input terminal pair. Bases of the transistors Q1 and Q4 are connected in common to each other to form the input terminal Tc being one of the second input terminal pair, while bases of the transistors Q2 and Q3 are connected in common to each other to form the input terminal Td being the other of the second input terminal pair.

In addition, collectors of the transistors Q1 and Q3 are connected in common to each other to form the output terminal Te being one of the output terminal pair, while collectors of the transistors Q2 and Q4 are connected in common to each other to form the output terminal Tf being the other of the output terminal pair.

The correction current generating circuit 3 includes a transistor Q7 having the same current gain α ($\alpha = I_C/I_E$) as the transistors Q1 to Q4 that form the Gilbert multiplier core 101 and a circuit for supplying a bias current to the transistor Q7, and uses those circuits to generate the correction current for correcting a constant current $I_0$ being a bias current component for one of the input signals of the Gilbert multiplier core 101 (input signal thereto on a side of the input terminals Tc and Td) to the current $\alpha \cdot I_0$ obtained by multiplying the bias current component by the above-mentioned current gain α.

The one of the two input signals of the Gilbert multiplier core 101 is corrected by the correction current generated by the correction current generating circuit 3, to thereby eliminate influence of the current gain α of the transistors Q1 to Q4 that form the Gilbert multiplier core 101 from an output voltage Vout of the Gilbert multiplier core 101.

To describe the correction current generating circuit 3 in more detail, the transistor Q7 is a first replica transistor being a bipolar transistor having the same current gain α as the transistors Q1 to Q4 that form the Gilbert multiplier core 101. The transistor Q7 has an emitter connected to a positive power source (+V) via a constant current source 301, and has a collector connected to a negative power source (−V) via a constant current source 302. Further, a diode-connected transistor Q8 is connected between the base of the transistor Q7 and the negative power source (−V) in a forward direction along a direction in which a current flows.

It is desired that the transistor Q8 be a second replica transistor being a bipolar transistor having the same structure and the same characteristics as the transistors Q5 and Q6 that form the linearizer circuit 102 of the analog multiplier unit 100A. This transistor device can also be realized by applying the above-mentioned semiconductor layout technology thereto.

In addition, a node p between the base of the transistor Q7 and the emitter of the transistor Q8 is connected to the positive power source (+V) via a constant current source 303, and a node q between the collector of the transistor Q7 and the constant current source 302 is connected to the positive power source (+V) via a diode-connected P-channel MOS transistor 304. The P-channel MOS transistor is hereinafter abbreviated as "PMOS".

A PMOS 305 is current-mirror-connected to the PMOS 304. Specifically, the PMOSs 304 and 305 have their gates connected in common to each other and their sources connected in common to each other. The PMOS 305 has a drain connected to the negative power source (−V) via a diode-connected N-channel MOS transistor 306. The N-channel MOS transistor is hereinafter abbreviated as "NMOS". Two NMOSs 307 and 308 are current-mirror-connected to the NMOS 306. Specifically, the NMOSs 306 to 308 have their gates connected in common to each other and their sources connected in common to each other. Those current mirror circuits may have a cascode structure in order to enhance accuracy of current copy.

The NMOSs 307 and 308 have their drains connected to the positive power source (+V) via constant current sources 309 and 310 each of which causes the constant current $I_0$ to flow. Correction current output lines 311 and 312 are drawn from nodes g and h between the drains of the NMOSs 307 and 308 and the constant current sources 309 and 310, respectively. The correction current output line 311 is connected to the input terminal Td of the Gilbert multiplier core 101 of the analog multiplier unit 100A and to a node r between the emitter of the transistor Q5 and a positive-side output line of the V-I conversion circuit 110. The correction current output line 312 is similarly connected to the input terminal Tc of the Gilbert multiplier core 101 and to a node s between the emitter of the transistor Q6 and a negative-side output line of the V-I conversion circuit 110.

The constant current source 301 feeds the constant current $I_0$, which corresponds to the bias current for a differential current input to the second input terminal pair Tc and Td of the Gilbert multiplier core 101, to the emitter of the transistor Q7. This configuration forms a replica current path corresponding to current paths of the transistors Q1 to Q4 within the Gilbert multiplier core 101.

Further, the constant current source 303 also feeds the constant current $I_0$ corresponding to the above-mentioned bias current to the emitter of the diode-connected transistor Q8. This configuration forms a replica current path corresponding to current paths of the transistors Q5 and Q6 within the linearizer circuit 102.

Figure 10:
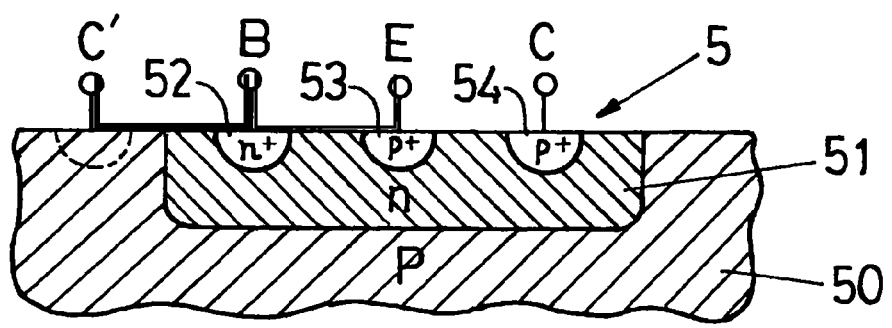
FIG. 10 is a schematic sectional view illustrating an example of a lateral bipolar transistor manufactured by a CMOS process.
Figure 11:
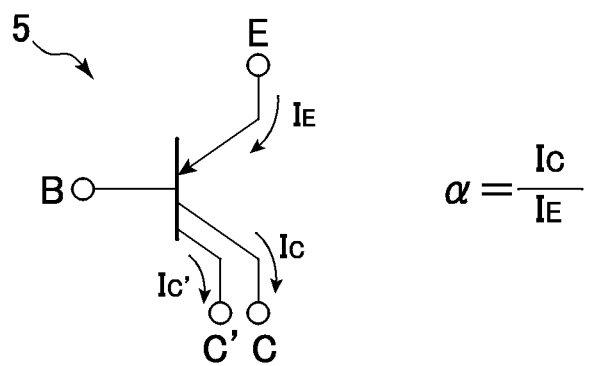
FIG. 11 is a circuit symbol diagram for illustrating a current gain of the lateral bipolar transistor manufactured by the CMOS process.

According to the correction current generating circuit 3, the constant current $I_0$ is supplied to the emitter of the transistor Q7. On the other hand, the current flowing through the collector of the transistor Q7 decreases from the constant current $I_0$ by an amount corresponding to the base current and the current flowing through a vertical collector C' described with reference to FIG. 10 and FIG. 11. The current gain α is determined in accordance therewith. The current α·$I_0$ being a collector current corresponding to the current gain α is caused to flow into the node q. The constant current $I_0$ is caused to flow from the node q to the negative power source (−V) by the constant current source 302, and hence the current (1−α)·$I_0$ is caused to flow from the positive power source (+V) to the node q through the PMOS 304.

The current (1−α)·$I_0$ is copied to the PMOS 305 that is current-mirror-connected to the PMOS 304, and is caused to flow also through the PMOS 305 and the NMOS 306 connected thereto in series. This current is copied to the NMOSs 307 and 308 that are current-mirror-connected to the NMOS 306, and the current (1−α)·$I_0$ is caused to flow thereto as well.

The constant current $I_0$ is caused to flow into the nodes g and h between the drains of the NMOSs 307 and 308 and the constant current sources 309 and 310 from the constant current sources 309 and 310, respectively, and hence the correction current output to each of the correction current output lines 311 and 312 becomes α·$I_0$ as expressed by the following expression.

$$I_0-(1-\alpha)\cdot I_0=\alpha\cdot I_0$$

The current α·$I_0$ being the correction current is caused to flow into the nodes r and s of the analog multiplier unit 100A by the correction current output lines 311 and 312, respectively, and is added to a current (±K1·Vy) output from the V-I conversion circuit 110.

With this configuration, the differential current caused to flow into the transistors Q5 and Q6 of the linearizer circuit 102 from the nodes r and s becomes α·$I_0$±K1·Vy.

That is, the constant current $I_0$ being the bias current for the differential current for inputs to the respective input terminals Tc and Td of the second input terminal pair of the Gilbert multiplier core 101 is corrected to the current α·$I_0$ obtained by multiplying the bias current $I_0$ by the current gain α.

The differential current (α·$I_0$±K1·Vy) is converted into the voltage signal Vi given by the following expression by the linearizer circuit 102, and is input to the second input terminal pair Tc and Td.

$$Vi=2\cdot V_T\cdot\tan h^{-1}(K1\cdot Vy/(\alpha\cdot I_0))$$

When the voltage signals Vx and Vy are multiplied by the Gilbert multiplier core 101, the output voltage Vout obtained by converting the differential current output from the output terminals Te and Tf into a voltage signal by the I-V conversion circuit 150 is expressed by an expression obtained by replacing letter $I_0$ in the following expression described in the "Solution to Problem" section by α·$I_0$.

$$Vout=K\cdot(Vx\cdot Vy/I_0)\cdot\alpha$$

Specifically, when $I_0$ in the above-mentioned expression is replaced by α·$I_0$, the following expression is obtained.

$$Vout=K\cdot\{Vx\cdot Vy/(\alpha\cdot I_0)\}\cdot\alpha$$

On the right-hand side, α in the denominator and α in the numerator are canceled out to obtain:

$$Vout=K\cdot(Vx\cdot Vy/I_0),$$

and the output voltage Vout being a multiplication result is free of the influence of the current gain α, which allows the multiplication to be performed with excellent accuracy at all times.

Note that, as described in the Background Art section, where conversion factors of the V-I conversion circuits 110 and 120 are denoted by K1 and K2 and a conversion factor of the I-V conversion circuit 150 is denoted by K5, K in each of the above-mentioned expressions is a constant coefficient expressed by the following expression.

$$K = 2 \cdot K1 \cdot K2 \cdot K5$$

According to the detector circuit of this embodiment, the voltage signal Vy has a constant amplitude, and hence as the voltage signal (output voltage Vout) output by the I-V conversion circuit 150, the demodulated signal corresponding to the amplitude of the voltage signal Vx being the modulated signal can be obtained with excellent accuracy without being influenced by the current gain α of the transistors Q1 to Q4 that form the Gilbert multiplier core 101.

The other functions of the analog multiplier unit 100A are the same as those of the analog multiplier circuit 100 described with reference to FIG. 9, and hence descriptions thereof are omitted. Note that, a PNP type is used for all of the respective bipolar transistors Q1 to Q8 within the analog multiplier circuit 1, but even if an NPN-type bipolar transistor is used, operating principles are the same only except that the direction of the current is reversed.

(Physical Quantity Sensor and Detector Circuit of Embodiment: FIG. 2 to FIG. 5)

Next, a description is made of a physical quantity sensor and the detector circuit that use the above-mentioned analog multiplier circuit according to the embodiment of the present invention with reference to FIG. 2 to FIG. 5.

Figure 2:
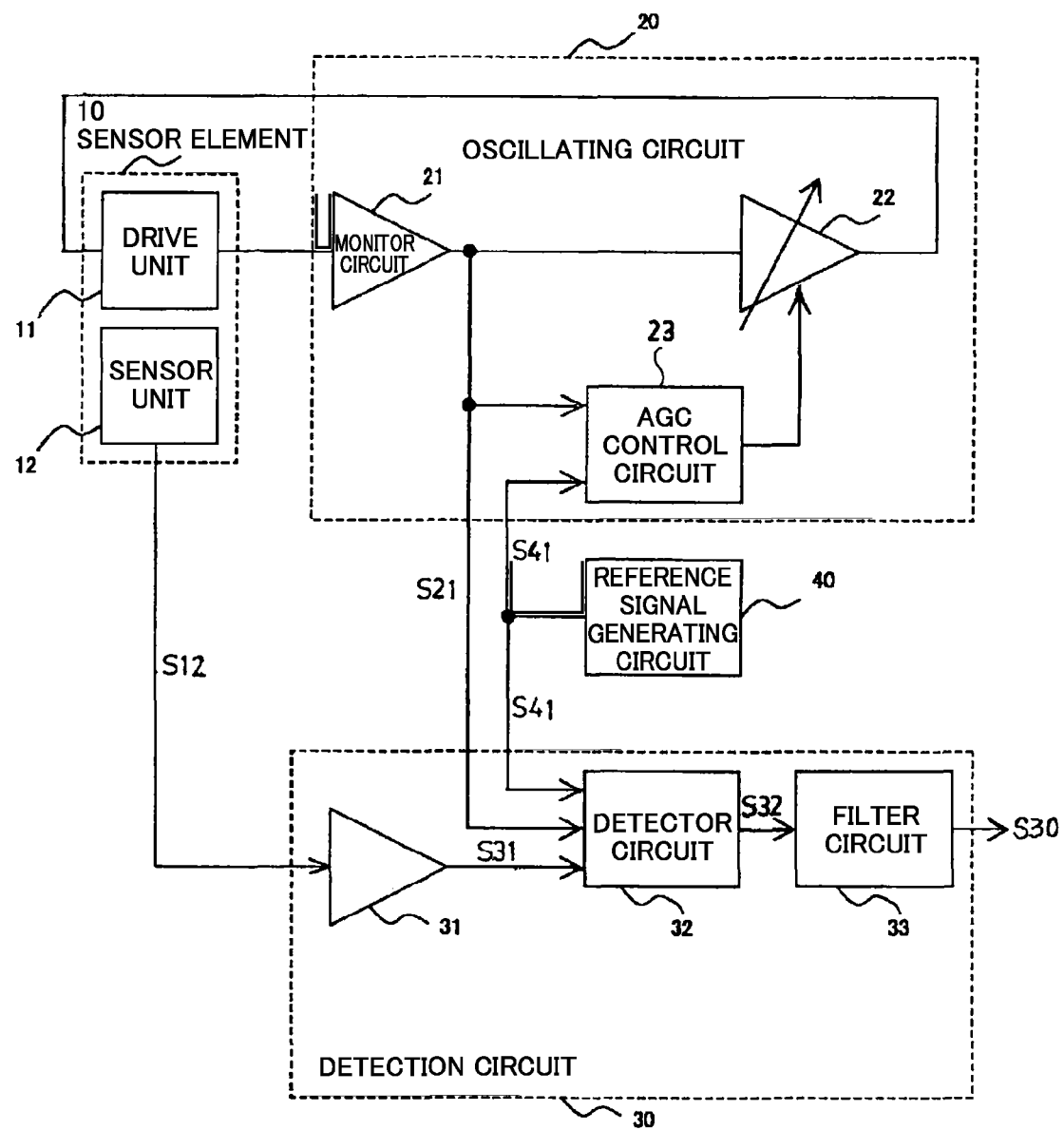
FIG. 2 is a block diagram illustrating an overall configuration of a physical quantity sensor according to an embodiment of the present invention.

(1) Description of Overall Configuration: FIG. 2

First, an overall configuration of the physical quantity sensor according to the embodiment of the present invention is described with reference to FIG. 2. The physical quantity sensor illustrated in FIG. 2 is an oscillation type angular velocity sensor including a sensor element 10, an oscillating circuit 20, a detection circuit 30, and a reference signal generating circuit 40.

The sensor element 10 is, for example, a gyro oscillator for detecting a rotation angular velocity, which is formed by arranging metal electrodes on a surface of a piezoelectric material formed to have a tuning fork shape, and includes a drive unit 11 and a sensor unit 12. After the sensor element 10 is driven to oscillate by the oscillating circuit 20, when receiving a rotation angular velocity during the oscillation, the sensor element 10 outputs a feeble AC signal from the sensor unit 12 as a sensor element output S12.

The reference signal generating circuit 40 is a circuit for generating a reference signal for an AGC control circuit described later. The reference signal generating circuit 40 used here is a constant voltage circuit for generating a reference signal S41 being a substantially constant voltage independent of an ambient temperature or a power supply voltage.

The oscillating circuit 20 is an oscillating circuit that forms an oscillating loop with respect to the sensor element 10 through a monitor circuit 21 and a variable gain amplifier 22 and has a so-called AGC function. Therefore, the oscillating circuit 20 includes an AGC control circuit 23, and has a function of controlling a gain of the variable gain amplifier 22 so that an effective value of an excitation current of the sensor element 10 becomes equal to the reference signal S41. Further, the oscillating circuit 20 converts the excitation current of the sensor element 10 into a voltage signal by using the monitor circuit 21.

With this configuration, the oscillation of the sensor element 10 is controlled by the AGC control circuit 23, and an oscillation signal S21 output by the monitor circuit 21 becomes an AC signal having an amplitude based on the reference signal S41. The oscillation signal S21 is also used as a signal used for the multiplication performed by a detector circuit 32 described later.

The detection circuit 30 includes an amplifier circuit 31, the detector circuit 32, and a filter circuit 33. The amplifier circuit 31 amplifies the sensor element output S12 being an output signal from the sensor unit 12 of the sensor element 10. The detector circuit 32 detects an angular velocity signal component included in an amplification signal S31 being an output signal of the amplifier circuit 31. The filter circuit 33 amplifies and smoothes an output signal S32 of the detector circuit 32 (in other words, demodulated signal), and outputs the amplified and smoothed demodulated signal as an output signal S30 of the physical quantity sensor. Of those, the detector circuit 32 includes an analog multiplier circuit for multiplying the amplification signal S31 being the output signal of the amplifier circuit 31 and the above-mentioned oscillation signal S21 in an analog manner, and uses the above-mentioned analog multiplier circuit.

The oscillating circuit 20 and the detection circuit 30 make an integrated circuit that operates by being connected to the positive power source (+V) and the negative power source (−V), and can be built on the same semiconductor substrate.

Here, a brief description is made of multiplication detection performed by the detector circuit 32. In general, when sinusoidal waves respectively having amplitudes of A and B but having the same frequency and the same phase are multiplied, the following expression is obtained.

$$(A \cdot \sin \theta) \cdot (B \cdot \sin \theta) = A \cdot B \cdot (1 - \cos 2\theta)/2$$

By regarding θ as a phase angle (θ=ω·t) proportional to time, it is understood from properties of trigonometric functions that two components of a signal having twice as high a frequency as the original signal and a DC signal are obtained from the above-mentioned multiplication. By causing the signal to pass through the filter circuit 33 through which only a low frequency passes, the DC signal having a magnitude of A·B/2 is obtained. The oscillation signal S21 and the amplification signal S31 are the signals having the same frequency. For example, the signal proportional to the rotation angular velocity is obtained by choosing a signal having a substantially constant amplitude A and a signal having an amplitude B proportional to the rotation angular velocity to be applied to perform such an arithmetic operation as expressed by the previous expression. The detector circuit 32 described below uses this principle to perform the detection.

Figure 3:
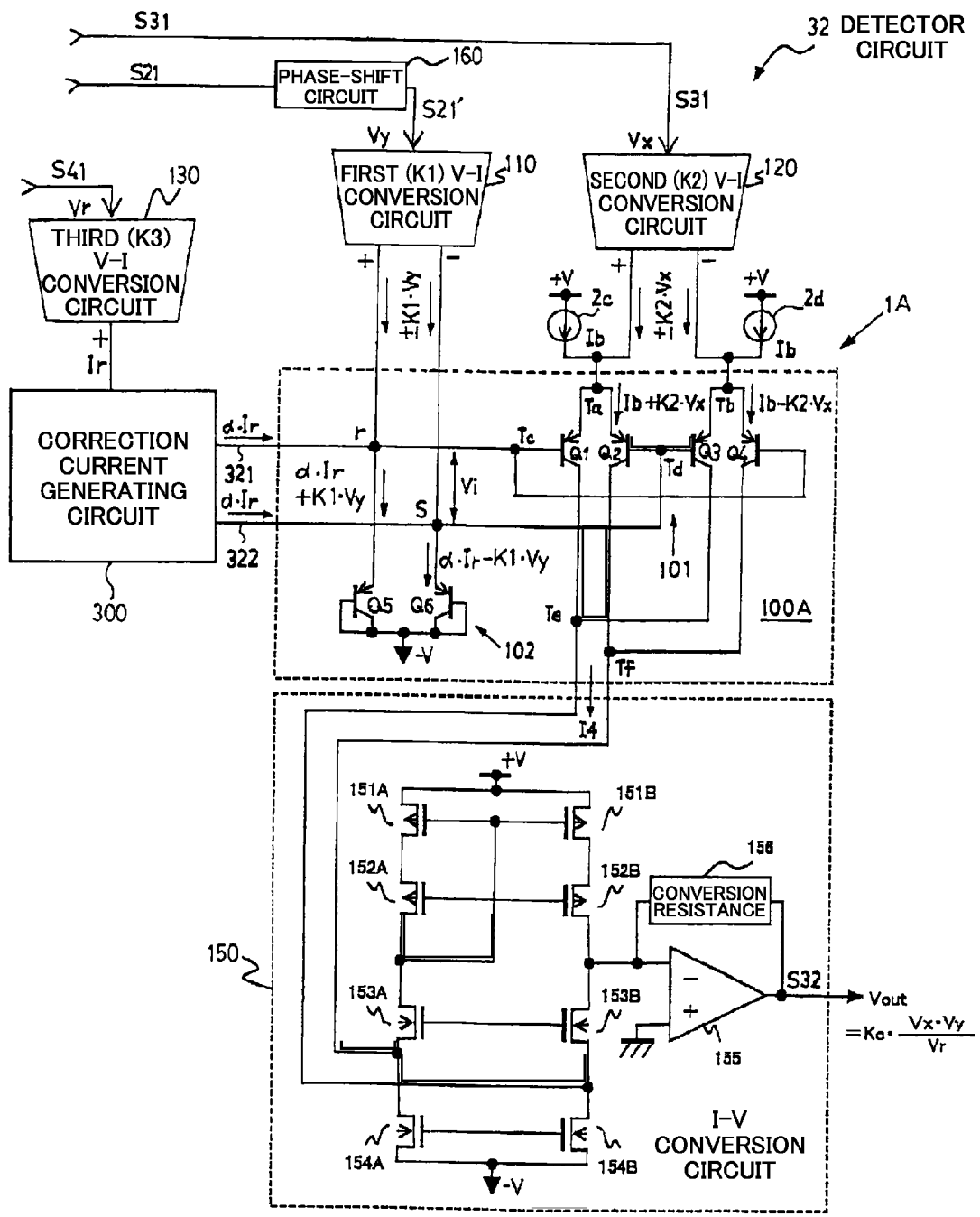
FIG. 3 is a circuit diagram illustrating a configuration example of the detector circuit of the physical quantity sensor illustrated in FIG. 2.

(2) Description of Configuration of Detector Circuit: FIG. 3

Next, the configuration of the detector circuit 32 within the physical quantity sensor illustrated in FIG. 2 is described with reference to FIG. 3. Note that, in FIG. 3, components corresponding to those described with reference to FIG. 1 and FIG. 9 are denoted by the same reference symbols, and duplicate descriptions thereof are omitted.

The detector circuit 32 includes first, second, and third V-I conversion circuits 110, 120, and 130, constant current sources 2*c* and 2*d*, an analog multiplier circuit 1A provided with the analog multiplier unit 100A and a correction current generating circuit 300, the I-V conversion circuit 150, and a phase-shift circuit 160.

The detector circuit 32 is provided with the first V-I conversion circuit 110 and the second V-I conversion circuit 120 (the same as the V-I conversion circuits 110 and 120 in FIG. 1) for converting the oscillation signal S21 and the amplification signal S31 into current signals, respectively. Ones having an output format of a differential output are used as those V-I conversion circuits. The configurations of the first and second V-I conversion circuits 110 and 120 are described later.

The oscillation signal S21 is input to the first V-I conversion circuit 110 via the phase-shift circuit 160. This is because the phases of the signals to be multiplied are to be made identical with each other as in the multiplication detection described above. The signal whose phase has been adjusted by the phase-shift circuit 160 is represented by an oscillation signal S21'. The oscillation signal S21' is an AC signal having a sinusoidal wave whose amplitude is controlled at a constant level by the above-mentioned operation of the AGC control circuit 23, and corresponds to the input signal given by the voltage signal Vy in FIG. 1 and FIG. 9. Therefore, among symbols indicating values of differential currents in FIG. 3 and the following description, a voltage value of the oscillation signal S21' is represented by Vy.

The first V-I conversion circuit 110 converts the oscillation signal S21' having the voltage value Vy into the differential current ($\pm K1 \cdot Vy$) by using the conversion factor K1, and outputs the resultant.

Figure 9:
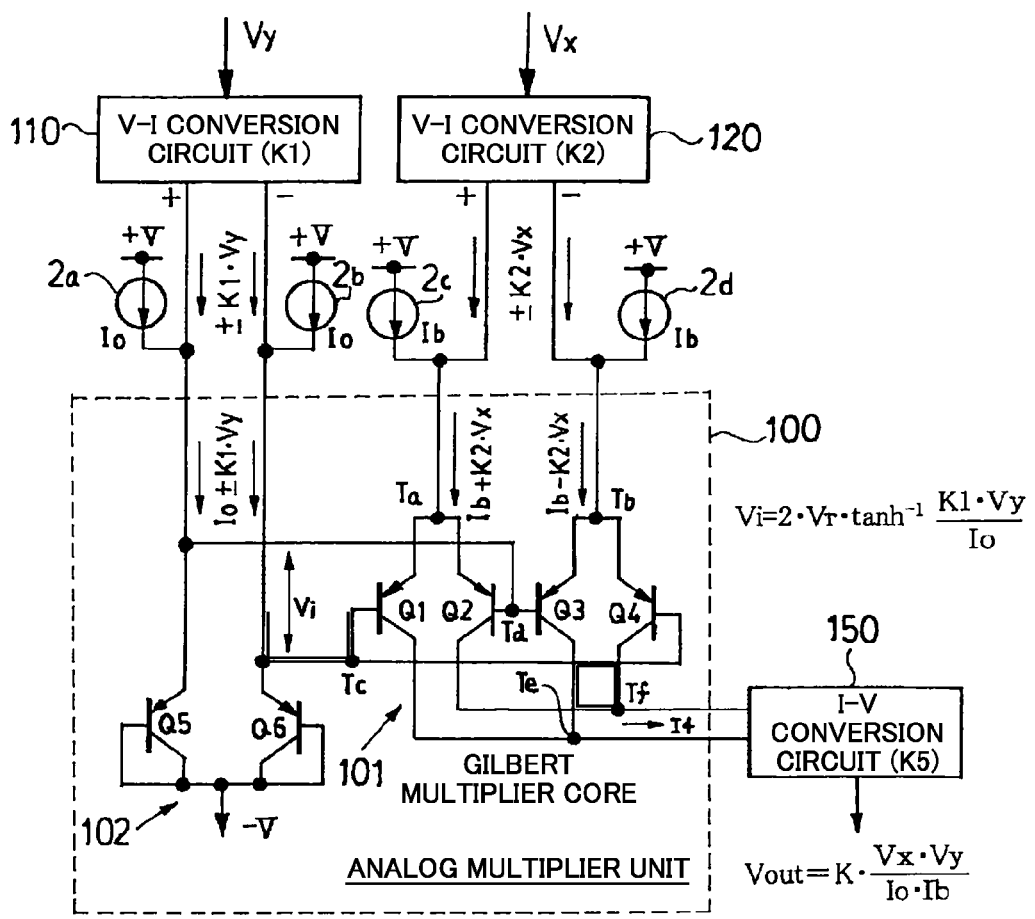
FIG. 9 is a circuit diagram illustrating an example of a conventional analog multiplier circuit using a Gilbert multiplier core.

The amplification signal S31 input to the second V-I conversion circuit 120 is a modulated signal having a sinusoidal wave that oscillates with the same frequency as that of the oscillation signal S21' being the AC signal, and corresponds to the input signal given by the voltage signal Vx in FIG. 1 and FIG. 9. Therefore, among the symbols indicating the values of the differential currents in the following description, the voltage value of the amplification signal S31 is represented by Vx.

The second V-I conversion circuit 120 converts the amplification signal S31 having the voltage value Vx into the differential current ($\pm K2 \cdot Vx$) by using the conversion factor K2, and outputs the resultant.

Note that, the constant current sources 2c and 2d add a bias current Ib to the differential current ($\pm K2 \cdot Vx$) output by the second V-I conversion circuit 120 to obtain the differential current ($Ib \pm K2 \cdot Vx$) including the bias current.

For convenience of description, those constant current sources 2c and 2d are illustrated separately from the second V-I conversion circuit 120, but those constant current sources may be provided within the second V-I conversion circuit 120, or the second V-I conversion circuit 120 and those constant current sources may be referred to collectively as a V-I conversion circuit for respectively converting the input signal into the differential current including the bias current.

The third V-I conversion circuit 130 is a circuit for converting the reference signal S41 (set to have a voltage value of Vr) into an output current Ir ($Ir=K3 \cdot Vr>0$) by using a conversion factor K3. The output current Ir corresponds to the constant current $I_0$ produced by the constant current source 301 and the like within the correction current generating circuit 3 in FIG. 1, but changes depending on the voltage value Vr of the reference signal S41.

As described above, the correction current generating circuit 300 is a circuit for correcting a bias current value of one of the input signals so as to prevent the multiplication result from fluctuating even when the current gain α of the bipolar transistors Q1 to Q4 that form the Gilbert multiplier core 101 fluctuates depending on temperature or the like.

The correction current generating circuit 300 according to this embodiment outputs the current α·Ir, which is corrected by multiplying the output current Ir of the third V-I conversion circuit 130 by the current gain α equivalent to the current gain α of the bipolar transistors Q1 to Q4 that form the Gilbert multiplier core 101, from correction current output lines 321 and 322, and supplies the current α·Ir to the nodes r and s of the analog multiplier unit 100A. Details thereof are described later with reference to FIG. 4.

The I-V conversion circuit 150 is a circuit for converting an output signal I4 from the analog multiplier unit 100A of the analog multiplier circuit 1A, which is a differential current, into the voltage signal by using the conversion factor K5. The I-V conversion circuit 150 illustrated in FIG. 3 converts the differential current input into a single-phase current signal by a so-called folded cascode circuit using PMOSs 151A, 151B, 152A, and 152B and NMOSs 153A, 153B, 154A, and 154B, and further performs I-V conversion therefore by a conversion resistance 156 and an operational amplifier 155 to output the output voltage Vout corresponding to the amplitude of the modulated signal. The conversion resistance 156 is made up of a linear resistance element such as a polysilicon resistance. Where a resistance value thereof is R5, K5=R5 is obtained.

Here, a description is made of a reason why the current α·Ir corresponding to the reference signal S41 (voltage value Vr) is used as the bias current added to the differential current ($\pm K1 \cdot Vy$) output from the first V-I conversion circuit 110 in response to the input signal given by the voltage signal Vy being the oscillation signal S21'.

In order to perform the detection based on the analog multiplication, it is necessary to use an AC signal having the same frequency as the modulated signal and having a constant amplitude. In the oscillation type physical quantity sensor, so-called AGC control for controlling an excitation level of an oscillating body to a constant level based on the reference signal using a constant voltage circuit or the like, and hence a controlled oscillation signal is used as the AC signal for the multiplication. However, in actuality, the reference signal changes depending on a change in temperature.

The amplification signal S31 obtained by amplifying the sensor element output S12, which is the modulated signal, is proportional not only to an angular velocity but also to an excitation level of the sensor element 10 being an oscillating body, and hence when the modulated signal (amplification signal S31) and the oscillation signal S21' obtained by adjusting the phase of the oscillation signal S21 are simply multiplied, a component obtained by squaring the reference signal S41 appears in a detector output signal (output voltage Vout). Therefore, a large error occurs in the detector output signal due to an error of the reference signal. This inhibits realization of high accuracy within a wide use temperature range, which has been demanded for the physical quantity sensor in recent years.

Therefore, in order to solve the problem, the physical quantity sensor is provided with the third V-I conversion circuit 130 to which the reference signal S41 is input as described above and an adding circuit for adding the output current Ir therefrom to the differential current ($\pm K1 \cdot Vy$) being one of the input signals to the analog multiplier unit 100A. This reduces fluctuations in the output signal due to voltage fluctuations of the reference signal.

Further in this embodiment, in order to eliminate the influence of the current gain α of the transistors Q1 to Q4 that form the Gilbert multiplier core 101, the current α·Ir obtained by correcting the output current Ir by the correction current generating circuit 300 is set as a current added to one of the input signals to the analog multiplier unit 100A.

Therefore, a current (α·Ir+K1·Vy) obtained by adding the current α·Ir generated based on the reference signal S41 to a positive output current (+K1·Vy) of the first V-I conversion circuit 110 flows into the emitter of the one transistor Q5 used to form the linearizer circuit 102 of the analog multiplier unit 100A.

In the same manner, a current (α·Ir−K1·Vy) obtained by adding the current α·Ir generated based on the reference signal S41 to a negative output current (inverted output current) (−K1·Vy) of the first V-I conversion circuit 110 flows into the emitter of the other transistor Q6 used to form the linearizer circuit 102.

In this embodiment, the above-mentioned adding circuit corresponds to a part for generating each sum of each of the output currents of the first V-I conversion circuit 110 and each of the output currents of the correction current generating circuit 300, and wirings involving the node r and the node s between the respective output terminals of the first V-I conversion circuit 110 and the correction current generating circuit 300 correspond to the adding circuit. This is because the addition of current signals can be performed by wirings.

The transistor Q5 and the transistor Q6 are each diode-connected, and have their bases and collectors connected to the negative power source (−V).

The emitter of the transistor Q5 is connected to the input terminal Tc connecting the bases of the transistors Q1 and Q4 of the Gilbert multiplier core 101. Further, the emitter of the transistor Q6 is connected to the input terminal Td connecting the bases of the transistors Q2 and Q3 of the Gilbert multiplier core 101.

On the other hand, a current (Ib+K2·Vx) obtained by adding the bias current Ib to a positive output current (+K2·Vx) of the second V-I conversion circuit 120 flows into the input terminal Ta connecting the emitters of the transistors Q1 and Q2 of the Gilbert multiplier core 101. In the same manner, a current (Ib−K2·Vx) obtained by adding the bias current Ib to a negative output current (inverted output current) (−K2·Vx) of the second V-I conversion circuit 120 flows into the input terminal Tb connecting the emitters of the transistors Q3 and Q4 of the Gilbert multiplier core 101. The bias current Ib is generated by the constant current sources 2c and 2d being bias current sources.

The bias current Ib and the output current Ir are added to the output currents of the V-I conversion circuits 120 and 130, for the purpose of preventing an occurrence of a cut-off of a bipolar transistor of the multiplier core ascribable to the fact that the current flowing through the bipolar transistor becomes negative even when the input signal is a positive value or a negative value. Therefore, the value of the bias current Ib is set depending on the range of the modulated signal being the input signal, that is, the voltage signal Vx.

In the Gilbert multiplier core 101, the output terminal Te connecting the collectors of the transistors Q1 and Q3 and the output terminal Tf connecting the collectors of the transistors Q2 and Q4 form the output terminal pair for outputting the output signal I4 being the multiplication results of the oscillation signal S21' and the amplification signal S31. The I-V conversion circuit 150 converts the differential current output from the output terminal pair Te and Tf into the voltage signal and outputs the output voltage Vout as described above.

Figure 4:
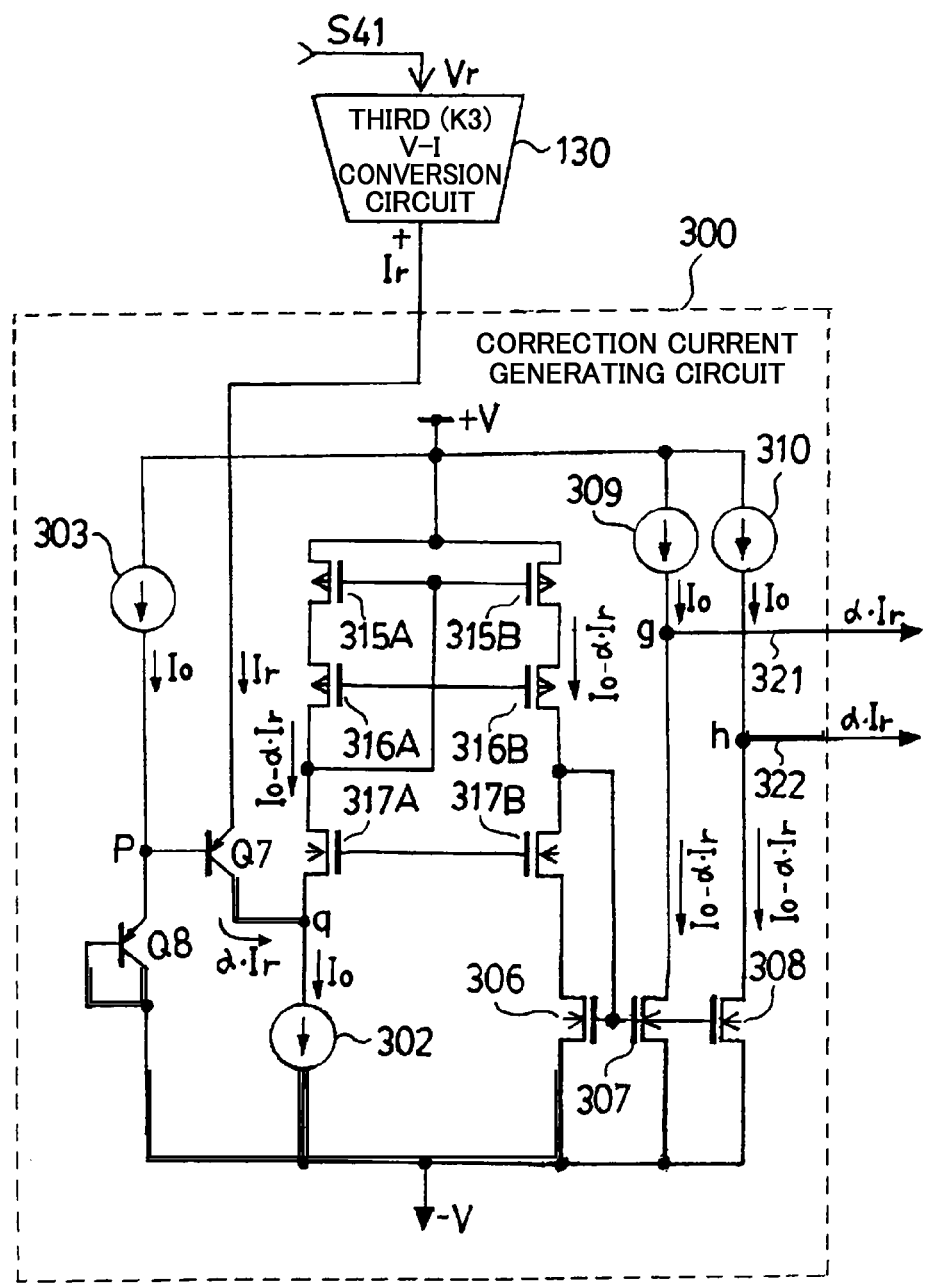
FIG. 4 is a circuit diagram illustrating a configuration example of a correction current generating circuit illustrated in FIG. 3.

(3) Description of Correction Current Generating Circuit: FIG. 4

A configuration of the correction current generating circuit 300 illustrated in FIG. 3 and an operation thereof are described with reference to FIG. 4.

The correction current generating circuit 300 illustrated in FIG. 4 has the basic configuration common with the correction current generation circuit 3 illustrated in FIG. 1, the common components being denoted by the same reference symbols, and detailed descriptions thereof are omitted.

As described above, the positive output current Ir generated from the reference signal S41 (voltage value Vr) by the third V-I conversion circuit 130 is input to the correction current generating circuit 300. Where the conversion factor of the third V-I conversion circuit 130 is denoted by K3, Ir=K3·Vr is obtained.

Then, instead of the constant current $I_0$ produced by the constant current source 301 within the correction current generating circuit 3 illustrated in FIG. 1, the correction current generating circuit 300 causes the output current Ir of the third V-I conversion circuit 130 to flow into the emitter of the transistor Q7 being the first replica transistor. In the same manner as the correction current generating circuit 3, the base of the transistor Q7 is connected to the node p between the emitter of the diode-connected transistor Q8 being the second replica transistor and the constant current source 303.

In addition, the correction current generating circuit 300 is different from the correction current generating circuit 3 illustrated in FIG. 1 in that the PMOS 304 and the PMOS 305 that are current-mirror-connected in the correction current generating circuit 3 are replaced by the current mirror circuit having a cascode configuration in order to enhance the accuracy of current copy.

In the current-mirror-circuit, PMOSs 315A and 316A and an NMOS 317A are cascode-connected between the positive power source (+V) and the node q between the collector of the transistor Q7 and the constant current source 302, and PMOSs 315B and 316B and an NMOS 317B that are cascode-connected are current-mirror-connected to the respective MOS transistors.

The source of the NMOS 317B is connected to the negative power source (−V) via the NMOS 306. The NMOSs 307 and 308 are current-mirror-connected to the NMOS 306.

Then, the correction current output lines 321 and 322 are drawn from the node g between the drain of the NMOS 307 and the constant current source 309 and the node h between the drain of the NMOS 308 and the constant current source 310, respectively.

In the correction current generating circuit 300, when the output current Ir is supplied to the emitter of the transistor Q7 being the first replica transistor, a collector current of α·Ir corresponding to the current gain α (α<1) of the transistor Q7 is caused to flow. This collector current flows into the node q between the collector of the transistor Q7 and the source of the NMOS 317A, then the constant current $I_0$ is caused to flow from the node q to the negative power source (−V) by the constant current source 302, and hence the current $(I_0−α·Ir)$ flows through a serial circuit of the PMOSs 315A and 316A and the NMOS 317A. This in turn causes the same amount of current $(I_0−α·Ir)$ to flow through a serial circuit of the PMOSs 315B and 316B and the NMOSs 317B and 306 and causes the current $(I_0−α·Ir)$ to flow through the NMOSs 307 and 308 that are current-mirror-connected to the NMOS 306.

The constant current $I_0$ flows into the nodes g and h between the respective drains of the NMOSs 307 and 308 and the constant current sources 309 and 310 from the constant current sources 309 and 310, respectively, and hence the currents output to the correction current output lines 321 and 322 respectively become α·Ir as expressed by the following expression. Those currents are supplied to the analog multiplier unit 100A as the correction current serving as the bias current.

$$I_0−(I_0−α·Ir)=α·Ir$$

Figure 5:
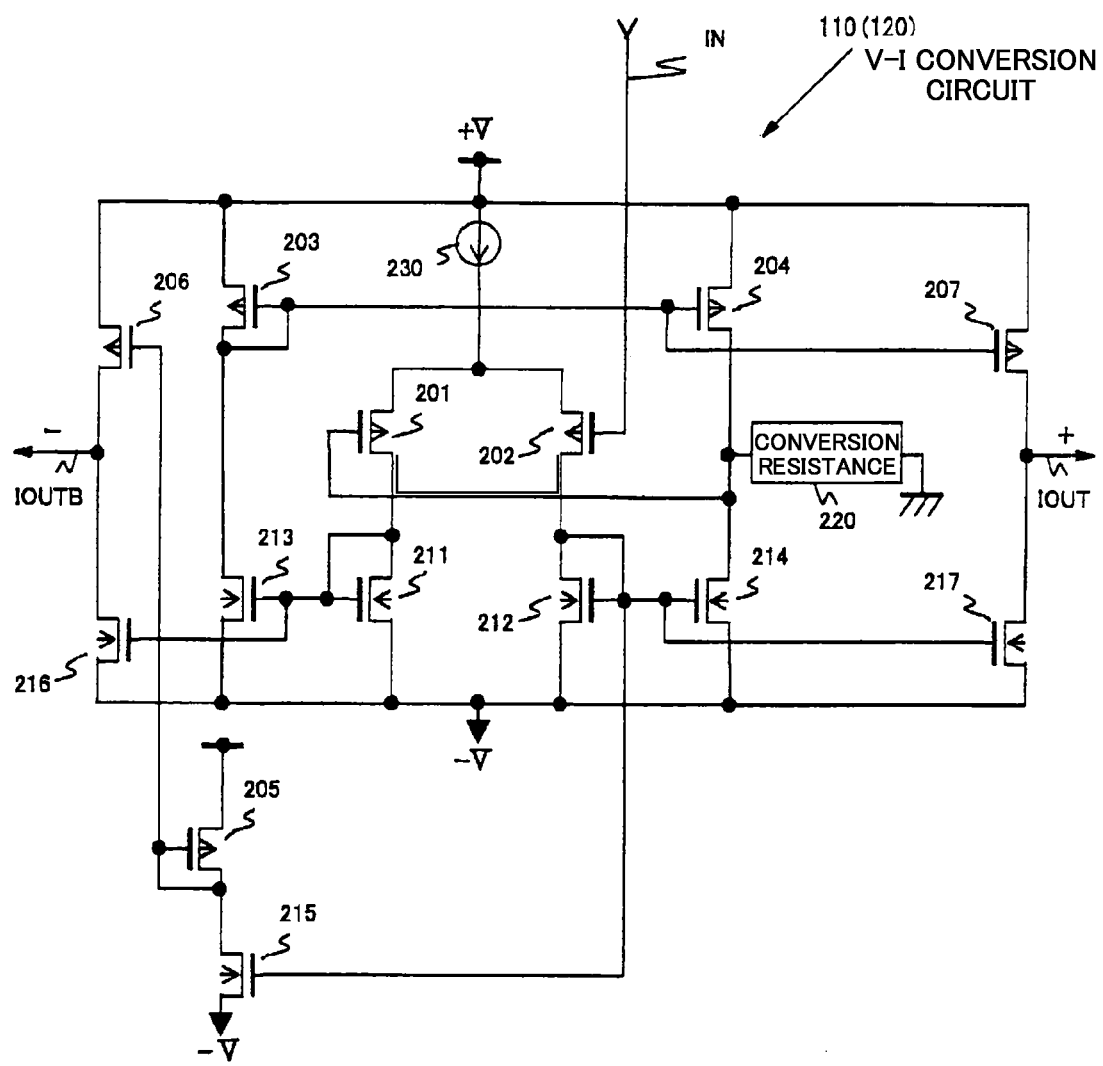
FIG. 5 is a circuit diagram illustrating a configuration example of first and second V-I conversion circuits illustrated in FIG. 3.

(4) Description of Configuration of V-I Conversion Circuit: FIG. 5

Next, configurations of the first V-I conversion circuit 110 and the second V-I conversion circuit 120 that are used for the detector circuit 32 illustrated in FIG. 3 are described with reference to FIG. 5. Those V-I conversion circuits each have the same configuration, being a trance conductance amplifier using MOS transistors and a resistance element, and each include PMOSs 201 to 207, NMOSs 211 to 217, a conversion resistance 220, and a tail current source 230.

A gate terminal of the PMOS 202 is an input terminal IN of the V-I conversion circuit. The PMOSs 201 and 202, the NMOSs 211 and 212, and the tail current source 230 form a differential pair circuit that uses the PMOSs 201 and 202 as input elements and the NMOSs 211 and 212 as load elements. The gate terminal of the PMOS 202 corresponds to a non-inverting input terminal of the differential pair circuit, and a gate terminal of the PMOS 201 corresponds to the inverting input terminal thereof. The bias current is supplied to the differential pair circuit by the tail current source 230.

The NMOS 211 and the NMOS 212 are each diode-connected. A current flowing through the NMOS 212 is duplicated to the NMOS 214 with a predetermined gain factor by the current mirror, and a current flowing through the NMOS 211 is duplicated with a predetermined gain factor to the PMOS 204 via the NMOS 213 and the PMOS 203. Drain terminals of the PMOS 204 and the NMOS 214 are connected to each other, and these terminals are connected to the gate terminal of the PMOS 201 corresponding to the inverting input terminal and one end of the conversion resistance 220. The other end of the conversion resistance 220 is grounded to a signal ground. Note that, the conversion resistance 220 is made up of a linear resistance element such as a polysilicon resistance.

In addition, a current flowing through the PMOS 204 is duplicated to the PMOS 207 by current-mirror-connection, and a current flowing through the NMOS 214 is duplicated to the NMOS 217 by current-mirror-connection. Drain terminals of the PMOS 207 and the NMOS 217 are connected to each other, and an output terminal IOUT is provided at the node.

The current flowing through the NMOS 211 is duplicated to the NMOS 216 with a predetermined gain factor by the current mirror, and the current flowing through the NMOS 212 is duplicated with a predetermined gain factor to the PMOS 206 via the NMOS 215 and the PMOS 205. Drain terminals of the PMOS 206 and the NMOS 216 are connected to each other, and an inverting output terminal IOUTB is provided at the node.

With such connections, the PMOSs 201 to 204 and the NMOSs 211 to 214 operate as a voltage follower on the assumption that one end of the conversion resistance 220 on a non-grounded side is an output, and the same signal as the signal input to the input terminal IN appears at the one end of the conversion resistance 220. In addition, the current flowing through the conversion resistance 220 is copied by a remaining MOS transistor, and a current having a value obtained by dividing an input signal voltage by the resistance value of the conversion resistance 220 is output from the output terminal IOUT. Then, a current having the same absolute value as the current output from the output terminal IOUT and having the reverse direction thereto is output from the inverting output terminal IOUTB.

This V-I conversion circuit operates so that the following relationship is established when an input voltage is denoted by V and the output current is denoted by I.

$$I = \pm K \cdot V$$

In the above-mentioned expression, K is a conversion factor, and is a reciprocal of the resistance value of the conversion resistance 220. Note that, this K is different from K in the expression of the output voltage Vout in FIG. 9 and FIG. 1. In FIG. 3, this conversion factor is set as K1 in the first V-I conversion circuit 110 and set as K2 in the second V-I conversion circuit 120. A double sign "±" corresponds to the output current of the output terminal (positive output terminal) and the output current of the inverting output terminal (negative output terminal), respectively.

The V-I conversion circuit described so far is a configuration used as the first V-I conversion circuit 110 and the second V-I conversion circuit 120 within FIG. 3. Although not particularly illustrated, the configuration of the third V-I conversion circuit 130 is a single-ended output, and hence the circuit for copying the current flowing through the PMOS 207 and the NMOS 217 by current-mirror-connection and the inverting output terminal IOUTB become unnecessary in the third V-I conversion circuit 130.

(5) Description of Operation of Physical Quantity Sensor: FIG. 2 and FIG. 3

Next, an operation of the physical quantity sensor according to this embodiment is described with reference to FIG. 2 and FIG. 3.

When the positive and negative power supply voltages are applied to the physical quantity sensor illustrated in FIG. 2, the reference signal generating circuit 40 outputs the reference signal S41, and the oscillating circuit 20 AC-drives the drive unit 11 of the sensor element 10 with a predetermined current value based on the reference signal S41. On this occasion, the AGC control is performed, and hence an AC voltage having an amplitude based on the reference signal S41 is output to the oscillation signal S21.

When the rotation angular velocity is applied to the physical quantity sensor in this state, an AC signal having an amplitude corresponding to the rotation angular velocity appears in the sensor element output S12. The detection circuit 30 amplifies the sensor element output S12, converts the sensor element output S12 into the voltage signal, and inputs the voltage signal to the detector circuit 32 as the amplification signal S31. The reference signal S41 and the oscillation signal S21 are further input to the detector circuit 32. The detector circuit 32 performs analog multiplication detection as described below, and smoothing processing is performed by the filter circuit 33 on the subsequent stage. As a result, the physical quantity sensor outputs the output signal S30 having a voltage proportional to the applied rotation angular velocity from the filter circuit 33.

Here, an operation of the detector circuit 32 of the physical quantity sensor according to this embodiment is described with reference to FIG. 3. Here, the voltage value of the oscillation signal S21' obtained by phase-adjusting the oscillation signal S21 by the phase-shift circuit 160 is denoted by Vy, the voltage value of the amplification signal S31 is denoted by Vx, and the voltage value of the reference signal S41 is denoted by Vr. Vy and Vx are sinusoidal signals (expressed in the form of A·sin θ) having the same frequency and the same phase.

When the conversion factor of the third V-I conversion circuit 130 is denoted by K3 (K3=1/R3 where R3 is the resistance value of the conversion resistance), a relationship between the voltage value Vr of the reference signal S41 and the output current Ir of the third V-I conversion circuit 130 can be expressed by the following expression.

$$Ir = K3 \cdot Vr = Vr/R3$$

Further, when the conversion factor of the first V-I conversion circuit 110 is denoted by K1 (K1=1/R1 where R1 is the resistance value of the conversion resistance 220 illustrated in FIG. 5); the conversion factor of the second V-I conversion circuit 120 is denoted by K2 (K2=1/R2 where R2 is the resistance value of the conversion resistance 220 illustrated in FIG. 5); a current signal flowing into the first input terminal pair Ta and Tb of the analog multiplier unit 100A is denoted by I1; and a current signal flowing into the transistors Q5 and Q6 of the linearizer circuit 102 connected to the second input terminal pair Tc and Td is denoted by I2, the current signals I1 and I2 are obtained by the following expressions.

$$I1 = Ib \pm K2 \cdot Vx$$

$$I2 = \alpha \cdot Ir \pm K1 \cdot Vy$$

Note that, the double sign "±" corresponds to the respective positive and negative of two signals that form a differential current signal.

In addition, where the output current of the analog multiplier unit 100A is denoted by I4, I4 is obtained by the following expression.

$$I4 = \{(K1 \cdot K2) \cdot (Vx \cdot Vy)/(\alpha \cdot Ir)\} \cdot \alpha$$

Here, where the conversion factor of the I-V conversion circuit 150 is denoted by K5 (K5=R5 where R5 is the resistance value of the conversion resistance 156 illustrated in FIG. 3), the output voltage Vout being the output signal S32 of the I-V conversion circuit 150 (in other words, detector output signal) is obtained by the following expression.

$$Vout = \{2 \cdot R5 \cdot (K1 \cdot K2) \cdot (Vx \cdot Vy)/(\alpha \cdot Ir)\} \cdot \alpha$$
$$= \{2 \cdot R5 \cdot (K1 \cdot K2) \cdot (Vx \cdot Vy)\}/Ir$$

As indicated by the above-mentioned expression, the current gain α of the bipolar transistors Q1 to Q4 that form the Gilbert multiplier core 101 is cancelled in the numerator and denominator, which eliminates the influence thereof. Accordingly, even when transistors whose current gain α fluctuates depending on the temperature or the like, such as lateral bipolar transistors manufactured by the CMOS process, are used as those elements, it is possible to obtain a detector output excellent in accuracy without being influenced thereby.

Further, Ir=Vr/R3 holds as described above, and hence, when Vr/R3 is substituted into Ir in the above-mentioned expression, the output voltage Vout is obtained by the following expression.

$$Vout = \{2 \cdot (R3 \cdot R5 \cdot K1 \cdot K2) \cdot (Vx \cdot Vy)\}/Vr$$

In this expression, the product of R3, R5, K1, and K2 is constant, and hence, by replacing 2·(R3·R5·K1·K2) with $K_0$ (constant coefficient), the output voltage Vout is expressed by the following expression.

$$Vout = K_0 \cdot (Vx \cdot Vy)/Vr$$

In the above-mentioned expression, Vy is the voltage value of the oscillation signal S21', and is therefore the same as the voltage value of the oscillation signal S21. The oscillation signal S21 is a signal whose oscillation amplitude is controlled by the AGC control circuit 23 illustrated in FIG. 2, and is dependent on (proportional to) the voltage value Vr of the reference signal S41 being a reference of the AGC control (Vy ∝ Vr).

Further, Vx is the voltage value of the amplification signal S31 obtained by amplifying an angular velocity signal obtained from the sensor unit 12 of the sensor element 10. Accordingly, the amplification signal S31 is proportional to an intensity of the applied angular velocity, and is also proportional to an intensity for exciting the drive unit 11 of the sensor element 10 in order to detect the angular velocity. That is, the amplification signal S31 is also proportional to the voltage value Vr of the reference signal S41 (Vx ∝ Vr).

Therefore, the product K·(Vx·Vy) included in the above-mentioned expression of the output voltage Vout being the output signal S32 of the I-V conversion circuit 150 is proportional to the applied angular velocity, and is proportional to the square of the voltage value Vr of the reference signal S41. However, in this embodiment, Vout=K·(Vx·Vy)/Vr holds as described above, and hence a Vr proportional component of the one of factors of Vx·Vy is canceled by the denominator Vr, with the result that the output voltage Vout is merely proportional to the voltage value Vr of the reference signal S41.

In the same manner, the output signal S30 of the physical quantity sensor, which is obtained by smoothing the output voltage Vout by the filter circuit 33 illustrated in FIG. 2, is simply proportional to the voltage value Vr.

That is, according to this embodiment, it is understood that dependence on the reference signal S41 of the output signal S30 of the physical quantity sensor can be suppressed to the extent of the first order. This characteristic itself is the same property as that of the physical quantity sensor using a conventional detector circuit based on switching detection, but in addition to the above-mentioned characteristic, the physical quantity sensor according to this embodiment is advantageous in the use of the analog multiplication detection. That is, a signal component to be detected in the physical quantity sensor according to this embodiment is only a component having the same frequency as an oscillation frequency. Therefore, even if noise having the other frequency components ascribable to the external oscillation or the like is included in the modulated signal, the noise component is frequency-converted into a frequency that is sufficiently higher than a DC by the analog multiplication detection, and can easily be removed by the filter circuit 33 on the subsequent stage.

Accordingly, by employing, as the physical quantity sensor, the detector circuit using the analog multiplier circuit as described in this embodiment, it is possible to realize a highly accurate physical quantity sensor that is small in the influence of the output signal due to the fluctuations of the reference voltage and is also resistant to the noise due to the externally-received oscillation.

In addition, K1, K2, and K3 included in $K_0$ as factors are the conversion factors that are used in the respective V-I conversion circuits 110, 120, and 130. As in this embodiment, by determining the conversion factors based on the resistance value of the conversion resistance formed by linear resistance elements, it is also possible to cancel a temperature coefficient, fluctuations in the semiconductor process, or the like between the conversion factor K3 and the conversion factor K1 or K2. In the same manner, by using the linear resistance element for the conversion resistance 156 used to form the I-V conversion circuit 150, it is also possible to cancel the temperature coefficient or the fluctuations in the semiconductor process between the resistance value R5 and the conversion factor K2 or K1.

When the values R1, R2, and R3 of the conversion resistances used for the first V-I conversion circuit 110, the second V-I conversion circuit 120, and the third V-I conversion circuit 130, respectively, are used, the above-mentioned expression of the output voltage Vout is rewritten as follows.

$$Vout = 2 \cdot \{(R3 \cdot R5)/(R1 \cdot R2)\} \cdot \{(Vx \cdot Vy)/Vr\}$$

It is understood from the above-mentioned expression that, by using the linear resistance elements all of which are made of the same material are used as the conversion resistances for the first, second, and third V-I conversion circuits 110, 120, and 130 and the I-V conversion circuit 150, an effect of canceling conversion errors that occur in the V-I conversion circuits 110, 120, and 130 and the I-V conversion circuit 150 is obtained.

Note that, in this embodiment, the configuration for adding the component of the reference signal to the input of the analog multiplier circuit involves a method for current addition in which the current signals generated by the V-I conversion respectively from the reference signal and the input signal for multiplication are added to each other, but the method for addition is not limited thereto. The same effect as this embodiment can be obtained from a method for voltage addition in which the reference signal and the input signal for multiplication are added to each other in the voltage signal state and then the resultant is subjected to the V-I conversion. The addition of the voltage signals can be performed by a well-known voltage adding circuit using an operational amplifier and the resistance element.

Further, in this embodiment, it is assumed that the reference signal used for the AGC control is the voltage signal, but it is apparent that the third V-I conversion circuit 130 is unnecessary if the reference signal is the current signal.

In this embodiment, the reference signal is added to the oscillation signal obtained from the drive circuit of a sensor element which is one of the two input signals to be multiplied, which may be reversed. That is, the reference signal may be added to the amplification signal obtained by amplifying a sensor element output which is the other one of the two input signals, and the addition signal and the oscillation signal may be input to the multiplier core. Even such a configuration allows the same operation as the above-mentioned embodiment. This is also apparent from the fact that a multiplication is commutative.

Note that, in the detector circuit 32 described with reference to FIG. 3, the correction current generating circuit 3 that outputs two currents of $\alpha \cdot I_0$ as the correction current illustrated in FIG. 1 can also be used instead of the third V-I conversion circuit 130 and the correction current generating circuit 300.

In that case, the output voltage Vout of the I-V conversion circuit 150 is obtained by the following expression.

$$Vout = 2 \cdot \alpha \cdot R5 \cdot K1 \cdot K2 \cdot Vx \cdot Vy/(\alpha \cdot I_0)$$
$$= 2 \cdot R5 \cdot K1 \cdot K2 \cdot Vx \cdot Vy/I_0$$

Also in this case, the output voltage Vout being the multiplication result of the voltage signals Vx and Vy is not influenced by the current gain α. Then, the demodulated signal corresponding to the amplitude of the voltage signal Vx being the modulated signal can be obtained with excellent accuracy without being influenced by the current gain α of the transistors Q1 to Q4 that form the Gilbert multiplier core 101.

Figure 6:
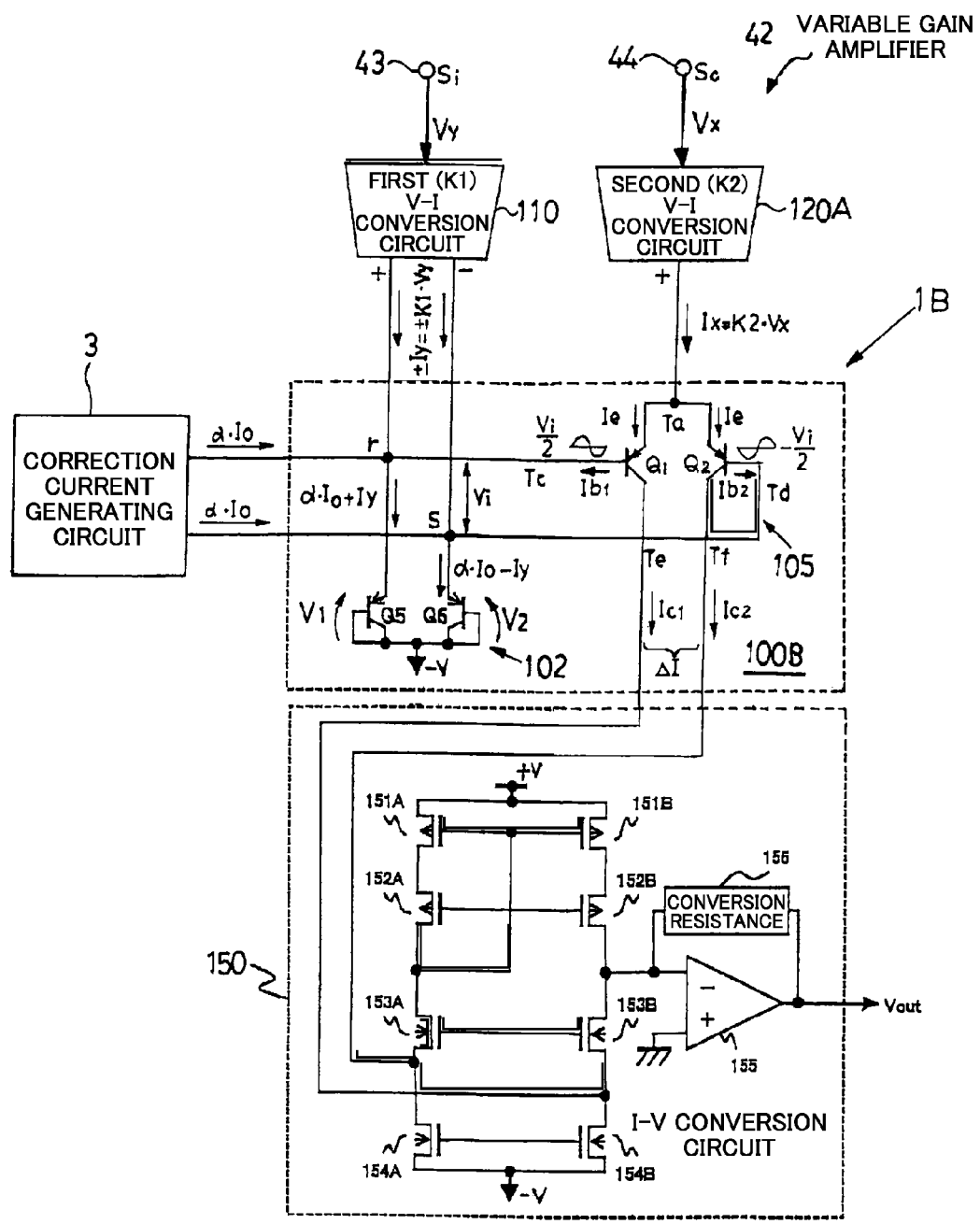
FIG. 6 is a circuit diagram illustrating another example of the analog multiplier circuit and a variable gain amplifier according to an embodiment of the present invention.

(Another Example of Analog Multiplier Circuit and Variable Gain Amplifier of Embodiment: FIG. 6)

Next, a description is made of another example of the analog multiplier circuit and a variable gain amplifier including the analog multiplier circuit according to the embodiment of the present invention with reference to FIG. 6. In FIG. 6, components corresponding to those described with reference to FIG. 3 are denoted by the same reference symbols, and descriptions thereof are omitted.

An analog multiplier circuit 1B according to this embodiment includes an analog multiplier unit 100B and the correction current generating circuit 3. The analog multiplier unit 100B includes a multiplier core 105 and the linearizer circuit 102.

The multiplier core 105 is a differential transistor pair including the transistors Q1 and Q2 being a pair of emitter-coupled bipolar transistors, in which the coupled emitter point of the differential transistor pair is set as the first input terminal Ta, the bases of those transistors are set as the second input terminal pair Tc and Td, and the collectors of those transistors are set as the output terminal pair Te and Tf. The multiplier core 105 is different from the Gilbert multiplier core.

The correction current generating circuit 3 is the same circuit as the correction current generating circuit 3 described with reference to FIG. 1, and corrects the constant current $I_0$ by using the current gain α of the transistor Q7 being the first replica having the same characteristics as those of the transistors Q1 and Q2 that form the multiplier core 105, to output the two correction currents $\alpha \cdot I_0$ which also serve as the bias currents.

A variable gain amplifier 42 according to this embodiment is a circuit for controlling the gain of an input signal Si (voltage value Vy) input to a second input terminal 43 in accordance with a DC control signal Sc (voltage value Vx) input to a first input terminal 44.

Therefore, in addition to the analog multiplier circuit 1B described above, the variable gain amplifier 42 includes the first V-I conversion circuit 110 for converting the input signal Si (voltage value Vy) into a differential current (±Iy) expressed by ±Iy=±K1·Vy, a second V-I conversion circuit 120A for converting the control signal Sc (voltage value Vx) into an only positive output current Ix expressed by Ix=K2·Vx, and the I-V conversion circuit 150 for converting the output signal of the multiplier core 105 within the analog multiplier circuit 1B into the voltage signal.

The second V-I conversion circuit 120A is a circuit obtained by excluding the inverting output terminal IOUTB and the circuit for generating the inverted output current thereof from the V-I conversion circuit illustrated in FIG. 5.

The output current Ix from the second V-I conversion circuit 120A is input to the first input terminal of the multiplier core 105. The differential current (±Iy) from the first V-I conversion circuit 110 and the current $\alpha \cdot I_0$ being the correction current from a correction current generating circuit 300A are added to each other. The differential current resulting from the addition is converted into the differential signal having a voltage difference corresponding to the voltage signal Vi by the linearizer circuit 102, and the differential signal is input to the second input terminal pair of the multiplier core 105. The I-V conversion circuit 150 supplies, as the output voltage Vout, the voltage signal obtained by amplifying the input signal Si by the gain controlled by the control signal Sc.

Now, actions of this embodiment are described in more detail.

In the multiplier core 105, the voltage difference applied to the second input terminal pair Tc and Td including the bases of the transistors Q1 and Q2 is Vi. Where the base current and the collector current of the transistor Q1 are denoted by $I_{B1}$ and $I_{C1}$, respectively, and the base current and the collector current of the transistor Q2 are denoted by $I_{B2}$ and $I_{C2}$, respectively, the following expression is established. $V_T$ is a so-called thermal voltage.

$$\frac{I_{B2}}{I_{B1}} = \frac{I_{C2}}{I_{C1}} = e^{Vi/V_T} \quad \text{[Math. 1]}$$

$$\therefore I_{C2} = I_{C1} \cdot e^{Vi/V_T}, \, I_{C1} = I_{C2} \cdot e^{-Vi/V_T}$$

Further, the output current Ix flowing into the first input terminal Ta of the multiplier core 105 from the second V-I conversion circuit 120A is a sum of emitter currents $I_{E1}$ and $I_{E2}$ of the transistors Q1 and Q2, and hence the following expression is established.

$$I_x = I_{E1} + I_{E2} \quad \text{[Math. 2]}$$

$$= \frac{1}{\alpha} \cdot (I_{C1} + I_{C2})$$

$$= \frac{I_{C1}}{\alpha} \cdot (1 + e^{Vi/V_T})$$

$$= \frac{I_{C2}}{\alpha} \cdot (1 + e^{-Vi/V_T})$$

$$\therefore \begin{cases} I_{C1} = \dfrac{\alpha \cdot I_x}{(1 + e^{Vi/V_T})} \\ I_{C2} = \dfrac{\alpha \cdot I_x}{(1 + e^{-Vi/V_T})} \end{cases}$$

Thus, the output current $\Delta I$ is obtained by the following expression.

$$\Delta I = I_{C2} - I_{C1} \quad \text{[Math. 3]}$$

$$= \alpha \cdot I_x \cdot \left( \frac{1}{1 + e^{-Vi/V_T}} - \frac{1}{1 + e^{Vi/V_T}} \right)$$

$$= \alpha \cdot I_x \cdot \tanh\left( \frac{Vi}{2 \cdot V_T} \right)$$

On the other hand, the transistors Q5 and Q6 of the linearizer circuit 102 are each diode-connected, and hence, where the emitter voltage of the transistor Q5 is denoted by V1 and the emitter voltage of the transistor Q6 is denoted by V2, the following expression is established. Is a so-called reverse direction saturation current.

$$\begin{cases} \alpha \cdot I_0 + I_y = I_S \cdot e^{V_1/V_T} \\ \alpha \cdot I_0 - I_y = I_S \cdot e^{V_2/V_T} \end{cases} \quad \text{[Math. 4]}$$

From this expression, the following expression regarding Vi is obtained.

$$Vi = V_1 - V_2 \quad \text{[Math. 5]}$$

$$= V_T \cdot \ln \frac{\alpha \cdot I_0 + I_y}{\alpha \cdot I_0 - I_y}$$

$$= V_T \cdot \ln \left( \frac{1 + \dfrac{I_y}{\alpha \cdot I_0}}{1 - \dfrac{I_y}{\alpha \cdot I_0}} \right)$$

-continued $$= 2 \cdot V_T \cdot \tanh^{-1}\left( \frac{I_y}{\alpha \cdot I_0} \right)$$

Based on the results of those expressions, the output voltage Vout of the I-V conversion circuit 150 is obtained by the following expression where the resistance value of the conversion resistance 156 is denoted by R5.

$$V_{out} = R5 \cdot (I_{C2} - I_{C1}) \quad \text{[Math. 6]}$$

$$= R5 \cdot \alpha \cdot I_x \cdot \tanh\left( \frac{Vi}{2 \cdot V_T} \right)$$

$$= \alpha \cdot R5 \cdot I_x \cdot \tanh\left\{ \frac{1}{2 \cdot V_T} \cdot 2 \cdot V_T \cdot \tanh^{-1}\left( \frac{I_y}{\alpha \cdot I_0} \right) \right\}$$

$$= \alpha \cdot R5 \cdot I_x \cdot \left( \frac{I_y}{\alpha \cdot I_0} \right)$$

$$= R5 \cdot \frac{I_x \cdot I_y}{I_0}$$

In the last deformation on the right-hand side of this expression, the current gain α is cancelled in the numerator and the denominator to disappear.

Because Ix=K2·Vx and Iy=K1·Vy hold, the above-mentioned expression can be further rewritten as follows.

Vout=R5·K1·K2·Vx·Vy/$I_0$

Because R5·K1·K2 is constant and $I_0$ is a constant current, the output voltage Vout is proportional to Vx·Vy. That is, the output voltage Vout being the multiplication result of the voltage signals Vx and Vy is not influenced by the current gain α of the transistors Q1 and Q2 that form the multiplier core 105, which allows the multiplication to be performed with excellent accuracy at all times.

With the variable gain amplifier 42 according to this embodiment, the output voltage Vout being the voltage signal obtained by amplifying the input signal Si by the gain controlled by the control signal Sc can be obtained with excellent accuracy without being influenced by the current gain α of the transistors Q1 and Q2 that form the multiplier core 105.

The variable gain amplifier 42 can also be used as the variable gain amplifier 22 of the oscillating circuit 20 within the physical quantity sensor illustrated in FIG. 2.

Figure 8:
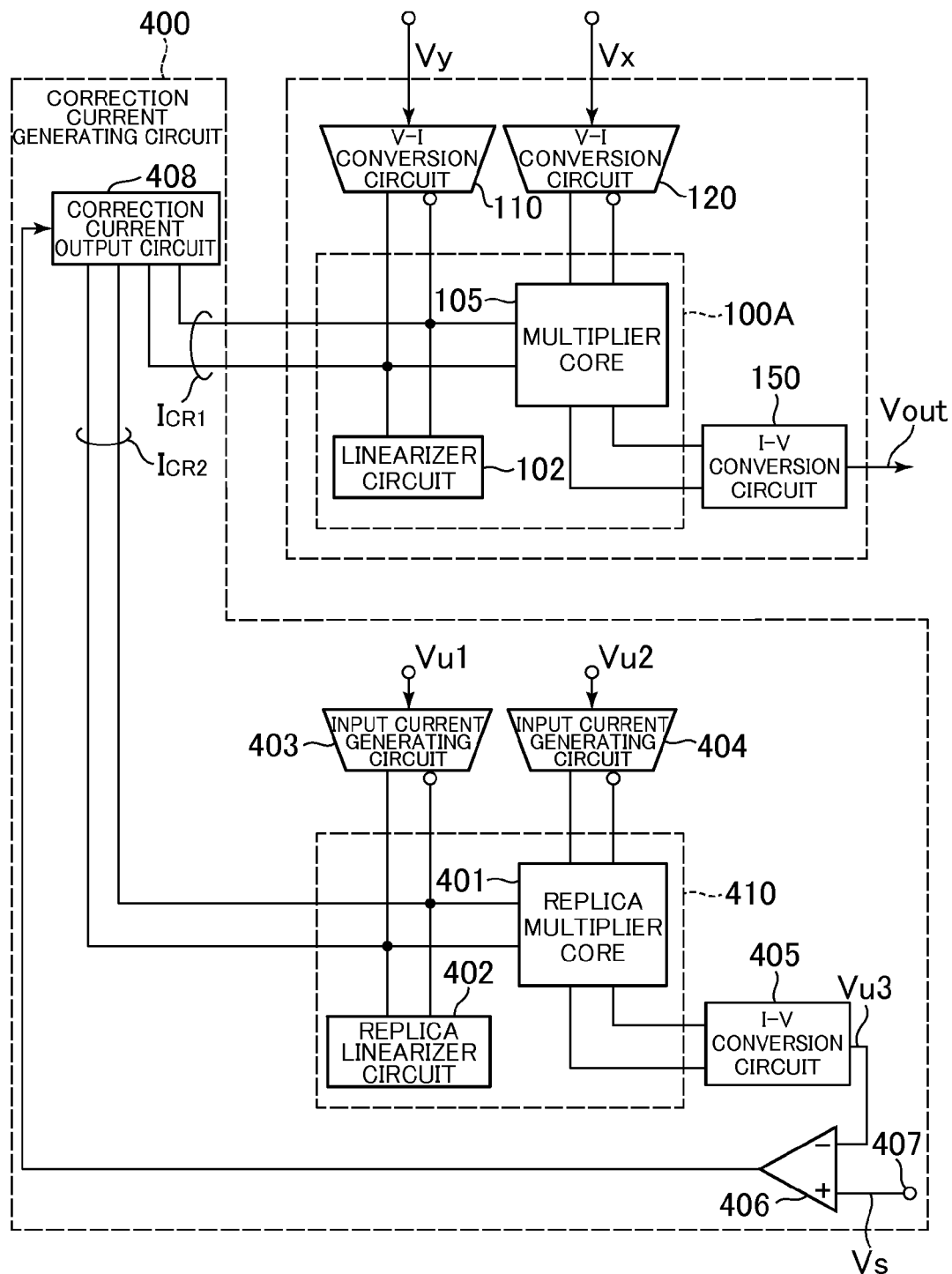
FIG. 8 is a block diagram of an outline illustrating further another example of the analog multiplier circuit according to an embodiment of the present invention.

(Further Another Example of Analog Multiplier Circuit of Embodiment: FIG. 8)

As has already been described, the analog multiplier circuit according to the present invention has a feature regarding a circuit configuration in that the correction current generating circuit generates the correction current that increases in accordance with the current gain α of the transistor of the analog multiplier unit, and the correction current is then added to one of the input signals to the multiplier core. This produces an effect of preventing, even when the current gain α of the transistor used to form the analog multiplier unit fluctuates depending on the temperature or the like, the multiplication result from being influenced by the fluctuations.

Figure 7:
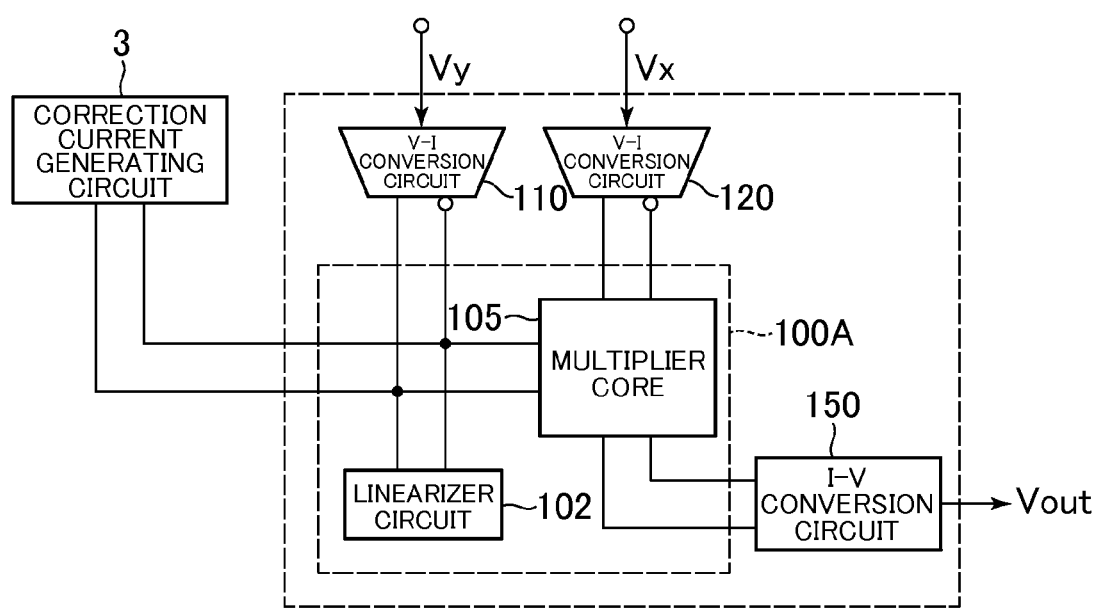
FIG. 7 is a block diagram of the analog multiplier circuit illustrated in FIG. 1.

FIG. 7 is a block diagram of the analog multiplier circuit illustrated in FIG. 1. As described above, in the analog multiplier circuit 1, the correction current generating circuit 3 uses the transistor Q7 being a replica transistor of the transistors Q1 to Q4 and the transistor Q8 being a replica transistor of the transistors Q5 and Q6 to generate α·$I_0$ as the correction current that increases in accordance with α. Such a circuit configuration of the correction current generating circuit 3 is an example of the circuit for generating the correction current, and another correction current generating circuit for generating the correction current that increases in accordance with the current gain α can also be used in the analog multiplier circuit according to the present invention.

FIG. 8 is a block diagram of an outline of an example of the analog multiplier circuit that uses the correction current generating circuit having a circuit configuration different from the correction current generating circuit 3. In FIG. 8, the same components as those described above are denoted by the same reference symbols, and duplicate descriptions thereof are omitted.

A correction current generating circuit 400 according to this embodiment includes a replica multiplier core 401, a replica linearizer circuit 402, a first input current generating circuit 403, a second input current generating circuit 404, an I-V conversion circuit 405, a comparator 406, an expected signal input circuit 407, and a correction current output circuit 408.

The replica multiplier core 401 is a replica of the multiplier core 105, has the same circuit configuration as the multiplier core 105, and includes first and second replica input terminal pairs and a replica output terminal pair corresponding to the first and second input terminal pairs and the output terminal pair of the multiplier core 105. Further, a transistor used to form the replica multiplier core 401 is a replica transistor having the same current gain α as the transistors Q1 to Q4 that form the multiplier core 105.

The replica linearizer circuit 402 is a replica of the linearizer circuit 102. That is, the replica linearizer circuit 402 is formed between the respective terminals of the second replica input terminal pair of the replica multiplier core 401 and the negative power source (−V) by connecting a pair of bipolar transistors being linearizing transistors, each of which is diode-connected (that is, has its base and its collector directly connected to each other), in the forward direction along the direction in which the current flows. The pair of bipolar transistors that form the replica linearizer circuit 402 are replica transistors having the same characteristics as the transistors Q5 and Q6 that form the linearizer circuit 102.

The replica multiplier core 401 and the replica linearizer circuit 402 form an analog multiplier unit 410 (replica multiplier unit) being the replica of the analog multiplier unit 100A.

The first input current generating circuit 403, the second input current generating circuit 404, and the expected signal input circuit 407 form a setting circuit for inputting a signal corresponding to a predetermined preparatory input value to each of first and second replica input terminals and inputting an expected signal corresponding to a predetermined expected value indicating the product of the input values to the comparator 406.

For example, the first input current generating circuit 403 can be the V-I conversion circuit for converting a predetermined input voltage Vu1 into the differential current, and the differential current is supplied to the second replica input terminal pair of the replica multiplier core 401. In the same manner, for example, the second input current generating circuit 404 can be the V-I conversion circuit for converting a predetermined input voltage Vu2 into the differential current, and the differential current is supplied to the first replica input terminal pair of the replica multiplier core 401.

It is preferred that the V-I conversion circuits that form the first and second input current generating circuits 403 and 404 be the same circuit configurations as the V-I conversion circuits 110 and 120, respectively. For example, the first and second input current generating circuits 403 and 404 input the input voltages Vu1 and Vu2 from the outside. Further, the first and second input current generating circuits 403 and 404 may generate inside thereof the input voltages Vu1 and Vu2 defined in advance, and may subject those voltages to the V-I conversion.

The expected signal input circuit 407 inputs the expected signal corresponding to the product of the input values indicated by the input voltages Vu1 and Vu2 to the comparator 406. The expected signal is a signal indicating the expected value of the output value supplied by the replica multiplier core 401 corresponding to the input voltages Vu1 and Vu2. For example, in the correction current generating circuit 400 illustrated in FIG. 8, the expected signal input circuit 407 is a terminal that is connected to the input of the comparator 406 and to which a voltage Vs is applied from the outside. In this case, the voltage Vs is generated by a user or the like based on the input voltages Vu1 and Vu2, and is applied to the terminal. Further, the expected signal input circuit 407 may be a circuit for generating the voltage Vs based on a signal input from the outside. Further, the expected signal input circuit 407 may be a circuit for generating inside thereof, the voltage Vs defined in advance so as to correspond to the predefined input voltages Vu1 and Vu2 as the expected signal.

The I-V conversion circuit 405 and the comparator 406 form a comparing circuit for comparing a trial output signal corresponding to the differential current output by the replica multiplier core 401 as the multiplication result of the input values indicated by the input voltages Vu1 and Vu2 with the expected signal and outputting a comparison result signal.

The I-V conversion circuit 405 converts the differential current output from the replica multiplier core 401 into a voltage Vu3 being a trial output signal, and inputs the voltage Vu3 to the comparator 406. The comparator 406 compares the voltage Vu3 with the voltage Vs, and outputs the comparison result signal indicating a magnitude relationship therebetween.

The correction current output circuit 408 generates a correction current $I_{CR1}$ and a replica correction current $I_{CR2}$ being the replica of the correction current. In the same manner as in the above-mentioned embodiment, the correction current $I_{CR1}$ is the correction current added to the second input terminal pair of the multiplier core 105. On the other hand, the replica correction current $I_{CR2}$ is added to the second replica input terminal pair of the replica multiplier core 401. The correction current $I_{CR1}$ and the replica correction current $I_{CR2}$ are each generated in pairs, and these four currents exhibit the same current value.

The correction current output circuit 408 increases/decreases the replica correction current $I_{CR2}$ in accordance with the comparison result signal so that the voltage Vu3 being the trial output signal becomes equal to the voltage Vs being the expected signal, and generates the correction current $I_{CR1}$ having the same magnitude as the replica correction current $I_{CR2}$.

In this embodiment, the correction current generating circuit 400 performs feedback control for the replica correction current $I_{CR2}$ so that the analog multiplier unit 410 being the replica of the analog multiplier unit 100A produces a correct result even when fluctuations occur in the current gain α of the transistor of the analog multiplier unit 100A including the multiplier core 105 and the linearizer circuit 102, and adds the result of the feedback control to the second input terminal pair of the multiplier core 105 as the correction current $I_{CR1}$, to thereby adjust the analog multiplier unit 100A so as to produce a correct multiplication result as well.

Note that, fluctuations in factors other than the current gain α that occur in the analog multiplier unit 100A occur in the analog multiplier unit 410 in the same manner. Therefore, the correction current generating circuit 400 according to this embodiment can obtain the multiplication result from which the influence of the fluctuations in factors other than the current gain α are eliminated.

The analog multiplier circuit illustrated in FIG. 8 can also be used for, for example, the detector circuit for the physical quantity sensor as illustrated in FIG. 2. It has been described above that, according to the detector circuit illustrated in FIG. 2, by setting the correction current as a current value proportional to the voltage value Vr of the reference signal, the dependence on Vr of the output voltage Vout in a case where the voltage values of the voltage signals Vx and Vy are proportional to the voltage value Vr of the reference signal can be weakened, specifically, the dependence can be limited to the proportionality to Vr. In the correction current generating circuit 400 illustrated in FIG. 8, by setting each of the voltage Vs and the input voltages Vu1 and Vu2 as a voltage signal having a voltage value proportional to the voltage value Vr, the correction current proportional to the voltage value Vr is output from the correction current output circuit 408. In this way, the above-mentioned effect is obtained, in which a fluctuation amount of the reference signal is inhibited from appearing in the output voltage Vout of the physical quantity sensor.

The preferred embodiments of the present invention have been described so far, but the present invention is not limited thereto. As a matter of course, natural that the configurations and the components of the respective embodiments can be appropriately added, omitted, or changed. Further, the configurations and the components of the respective embodiments can be combined within the scope of consistency.

The analog multiplier circuit according to the present invention can also be used for a general detector circuit and the detector circuit within the physical quantity sensor other than the angular velocity sensor. In those detector circuits, such an input of the reference signal as described in the embodiment with reference to FIG. 3 is sometimes unnecessary, and in that case, the third V-I conversion circuit 130 becomes unnecessary. Accordingly, the detector circuit as illustrated in FIG. 1 or FIG. 6 may be used.

INDUSTRIAL APPLICABILITY

The analog multiplier circuit, the detector circuit, the physical quantity sensor, and the variable gain amplifier according to the present invention are extremely effective when used for an oscillation type angular sensor as described above. Further, the analog multiplier circuit, the detector circuit, the physical quantity sensor, and the variable gain amplifier according to the present invention can also be used for an acceleration sensor, a magnetic sensor, and other such various physical quantity sensors other than the angular velocity sensor. Further, the detector circuit using the analog multiplier circuit according to the present invention can also be used for various detector circuits such as a detector circuit included in a receiving IC for receiving a radio wave signal indicating the standard time, and can also be used for not only a synchronous detector circuit but also a heterodyne detector circuit.

In addition, the analog multiplier circuit according to the present invention can naturally be used for pure arithmetic operations for outputting the product of two signals, and can also be used for a frequency multiplier, a phase comparator of a PLL circuit, and the like.

The invention claimed is:

1. An analog multiplier circuit, comprising:
a multiplier core comprising at least one differential transistor pair including a pair of emitter-coupled bipolar transistors, in which a coupled emitter point of the at least one differential transistor pair is set as a first input terminal, two bases of the differential transistor pair are set as a pair of second input terminals, and two collectors of the differential transistor pair are set as a pair of output terminals;
a linearizer circuit comprising a linearizing transistor pair including a pair of bipolar transistors whose emitters are respectively connected to the second input terminal pair, in which each base and each collector of the linearizing transistor pair are each connected to a predetermined power source; and
a correction current generating circuit for adding a correction current proportional to a current gain of each of the bipolar transistors of the at least one differential transistor pair to a signal applied to the second input terminal pair, the current gain being defined by a ratio of a collector current to an emitter current.

2. An analog multiplier circuit, comprising:
a multiplier core comprising at least one differential transistor pair including a pair of emitter-coupled bipolar transistors, in which a coupled emitter point of the at least one differential transistor pair is set as a first input terminal, two bases of the differential transistor pair are set as a pair of second input terminals, and two collectors of the differential transistor pair are set as a pair of output terminals;
a linearizer circuit comprising a linearizing transistor pair including a pair of bipolar transistors whose emitters are respectively connected to the second input terminal pair, in which each base and each collector of the linearizing transistor pair are each connected to a predetermined power source; and
a correction current generating circuit for adding a correction current corresponding to a current gain of each of the bipolar transistors of the at least one differential transistor pair to a signal applied to the second input terminal pair, the current gain being defined by a ratio of a collector current to an emitter current,
wherein the correction current generating circuit comprises a first replica transistor being a replica of each of the bipolar transistors of the at least one differential transistor pair, and generates the correction current based on a current obtained from a collector of the first replica transistor by feeding a predetermined bias current to an emitter of the first replica transistor.

3. The analog multiplier circuit according to claim 2, wherein:
the correction current generating circuit comprises a second replica transistor being a replica of each of the bipolar transistors of the linearizing transistor pair; and
an emitter of the second replica transistor is connected to a base of the first replica transistor, and a collector and a base of the second replica transistor are each connected to a predetermined power source.

4. The analog multiplier circuit according to claim 1, wherein:
the correction current generating circuit comprises:
a replica multiplier unit being a replica of the multiplier core and the linearizer circuit, the replica multiplier unit comprising a first replica input terminal, a pair of second replica input terminals, and a pair of replica output terminals being replicas of the first input terminal, the pair of the second input terminals, and the pair of the output terminals, respectively;
a comparing circuit for comparing a trial output signal corresponding to an output from the replica output terminal pair with an expected signal, and outputting a comparison result signal;

a setting circuit for inputting a signal corresponding to a predetermined preparatory input value to each of the first replica input terminal and the second replica input terminal pair and inputting the expected signal corresponding to a predetermined expected value indicating a product of the preparatory input values to the comparing circuit; and a correction current output circuit for generating the correction current and a replica correction current that is a replica current of the correction current and is to be added to a signal applied to the second replica input terminal pair; and the correction current output circuit increases/decreases the correction current and the replica correction current in accordance with the comparison result signal so that the trial output signal becomes equal to the expected signal.

5. The analog multiplier circuit according to claim 1, wherein the multiplier core comprises two differential transistor pairs, in which a pair of the first input terminals are respectively coupled emitter points of the two respective differential transistor pairs, the pair of the second input terminals are respectively the two bases coupled to each other between the two differential transistor pairs, and the pair of the output terminals are respectively the two collectors coupled to each other between the two differential transistor pairs.

6. A variable gain amplifier, comprising the analog multiplier circuit according to claim 1, wherein:
a DC control signal is input to the first input terminal;
an input signal is input to the second input terminal pair; and
the variable gain amplifier obtains a variable signal based on an output signal of the output terminal pair.

7. A detector circuit, comprising the analog multiplier circuit according to claim 5, wherein:
an AC signal having a constant amplitude is input to one of the first input terminal and the second input terminal pair, and a modulated signal is input to another of the first input terminal and the second input terminal pair; and
the detector circuit obtains a demodulated signal based on an output signal of the output terminal pair.

8. A physical quantity sensor, comprising:
a vibratory transducer for converting a physical quantity applied from outside into an electric signal;
a reference signal generating circuit for outputting a reference signal;
an oscillating circuit for causing the vibratory transducer to oscillate based on the reference signal; and
a detector circuit for demodulating an output signal from the vibratory transducer based on an oscillation signal from the oscillating circuit, wherein:

the detector circuit comprises the detector circuit according to claim 7;
the AC signal comprises the oscillation signal; and
the modulated signal comprises the output signal from the vibratory transducer.

9. The physical quantity sensor according to claim 8, wherein the correction current generating circuit generates the correction current based on the reference signal.

10. The analog multiplier circuit according to claim 2, wherein the multiplier core comprises two differential transistor pairs, in which a pair of the first input terminals are respectively coupled emitter points of the two respective differential transistor pairs, the pair of the second input terminals are respectively the two bases coupled to each other between the two differential transistor pairs, and the pair of the output terminals are respectively the two collectors coupled to each other between the two differential transistor pairs.

11. A variable gain amplifier, comprising the analog multiplier circuit according to claim 2, wherein:
a DC control signal is input to the first input terminal;
an input signal is input to the second input terminal pair; and
the variable gain amplifier obtains a variable signal based on an output signal of the output terminal pair.

12. A detector circuit, comprising the analog multiplier circuit according to claim 10, wherein:
an AC signal having a constant amplitude is input to one of the first input terminal and the second input terminal pair, and a modulated signal is input to another of the first input terminal and the second input terminal pair; and
the detector circuit obtains a demodulated signal based on an output signal of the output terminal pair.

13. A physical quantity sensor, comprising:
a vibratory transducer for converting a physical quantity applied from outside into an electric signal;
a reference signal generating circuit for outputting a reference signal;
an oscillating circuit for causing the vibratory transducer to oscillate based on the reference signal; and
a detector circuit for demodulating an output signal from the vibratory transducer based on an oscillation signal from the oscillating circuit, wherein:
the detector circuit comprises the detector circuit according to claim 12;
the AC signal comprises the oscillation signal; and
the modulated signal comprises the output signal from the vibratory transducer.

14. The physical quantity sensor according to claim 13, wherein the correction current generating circuit generates the correction current based on the reference signal.

* * * * *